United States Patent
Okada et al.

(10) Patent No.: US 12,557,614 B2
(45) Date of Patent: Feb. 17, 2026

(54) SEMICONDUCTOR DEVICE, SEMICONDUCTOR DEVICE MANUFACTURING METHOD, AND SUBSTRATE REUSING METHOD

(71) Applicant: Kioxia Corporation, Tokyo (JP)

(72) Inventors: Shunsuke Okada, Suzuka Mie (JP); Tatsunori Isogai, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 359 days.

(21) Appl. No.: 17/679,614

(22) Filed: Feb. 24, 2022

(65) Prior Publication Data

US 2023/0096632 A1 Mar. 30, 2023

(30) Foreign Application Priority Data

Sep. 17, 2021 (JP) .................................. 2021-152458

(51) Int. Cl.
*H01L 21/78* (2006.01)
*H01L 23/00* (2006.01)
(Continued)

(52) U.S. Cl.
CPC .......... *H01L 21/7813* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80006* (2013.01); *H01L 2224/80895* (2013.01);
(Continued)

(58) Field of Classification Search
CPC . H01L 21/7813; H01L 24/08; H01L 25/0657; H01L 25/18; H01L 24/80; H01L 25/50; H01L 2224/08145; H01L 2224/80006; H01L 2224/80895; H01L 2224/80896; H01L 2924/1431; H01L 2924/14511; H01L 2221/68359; H01L 21/6835; H01L 2221/68345
See application file for complete search history.

(56) References Cited

U.S. PATENT DOCUMENTS

2002/0045327 A1 * 4/2002 Yanagita ........... H01L 21/76259
438/459
2004/0232458 A1 11/2004 Natori et al.
(Continued)

FOREIGN PATENT DOCUMENTS

JP H06-275866 A 9/1994
JP 2001-189460 A 7/2001
(Continued)

*Primary Examiner* — Thanh Y. Tran
(74) *Attorney, Agent, or Firm* — Foley & Lardner LLP

(57) ABSTRACT

A semiconductor device manufacturing method includes forming a first film containing a first device on a first substrate, forming a second film containing a semiconductor layer on a second substrate, and changing the semiconductor layer into a porous layer. The method further includes forming a third film containing a second device on the second film, and bonding the first substrate and the second substrate to sandwich the first film, the third film, and the second film therebetween. The method further includes separating the first substrate and the second substrate from each other at a position of the second film.

13 Claims, 16 Drawing Sheets

(51) Int. Cl.
*H01L 25/00* (2006.01)
*H01L 25/065* (2023.01)
*H01L 25/18* (2023.01)

(52) U.S. Cl.
CPC ............... *H01L 2224/80896* (2013.01); *H01L 2924/1431* (2013.01); *H01L 2924/14511* (2013.01)

(56) References Cited

U.S. PATENT DOCUMENTS

| | | | |
|---|---|---|---|
| 2006/0113635 A1* | 6/2006 | Notsu | ................ H01L 21/0262 257/E21.12 |
| 2008/0315286 A1 | 12/2008 | Ieda | |
| 2009/0142904 A1 | 6/2009 | Isaka et al. | |
| 2009/0267225 A1 | 10/2009 | Eguchi | |
| 2017/0309731 A1 | 10/2017 | Yamazaki et al. | |
| 2017/0317226 A1 | 11/2017 | Yamaguchi | |
| 2020/0286876 A1 | 9/2020 | Nakaki | |
| 2020/0303241 A1 | 9/2020 | Matsuo | |
| 2021/0074672 A1 | 3/2021 | Matsuo et al. | |
| 2021/0280499 A1 | 9/2021 | Or-Bach et al. | |
| 2021/0292928 A1 | 9/2021 | Niwa et al. | |
| 2022/0059408 A1* | 2/2022 | Hayashi | ................ H10B 41/40 |
| 2022/0073801 A1* | 3/2022 | Ogino | ................ B32B 43/006 |
| 2022/0189994 A1* | 6/2022 | Augendre | ............... H01L 21/74 |
| 2022/0251722 A1 | 8/2022 | Matsuo | |

FOREIGN PATENT DOCUMENTS

| | | |
|---|---|---|
| JP | 2009-033118 A | 2/2009 |
| JP | 2009-283929 A | 12/2009 |
| JP | 2020-145233 A | 9/2020 |
| JP | 2020-155493 A | 9/2020 |
| JP | 2021-044408 A | 3/2021 |
| JP | 2021-152202 A | 9/2021 |
| JP | 2022-122494 A | 8/2022 |
| TW | 200947610 A | 11/2009 |
| TW | 201802872 A | 1/2018 |
| TW | 201806138 A | 2/2018 |
| WO | WO-2004/017410 A1 | 2/2004 |

* cited by examiner

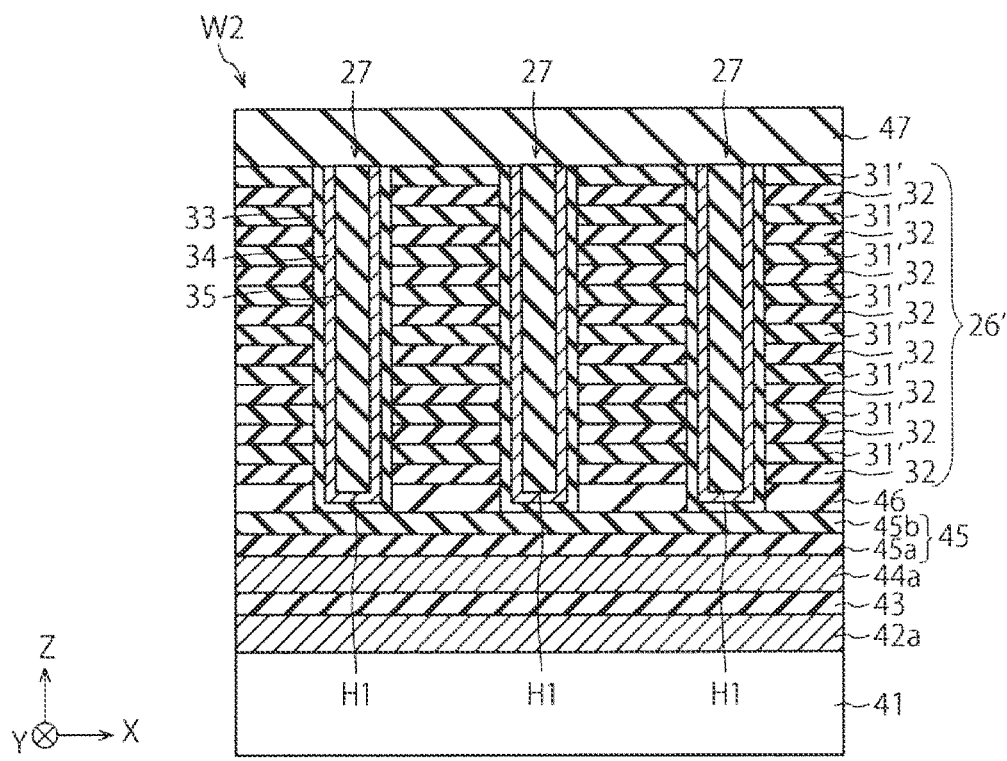
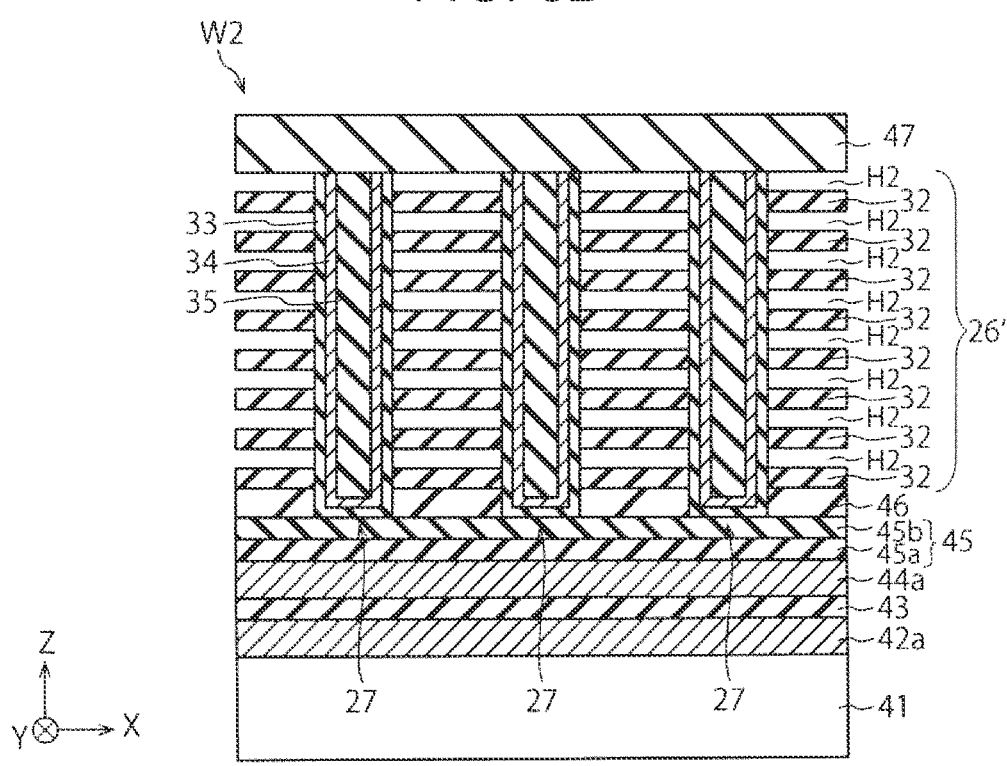

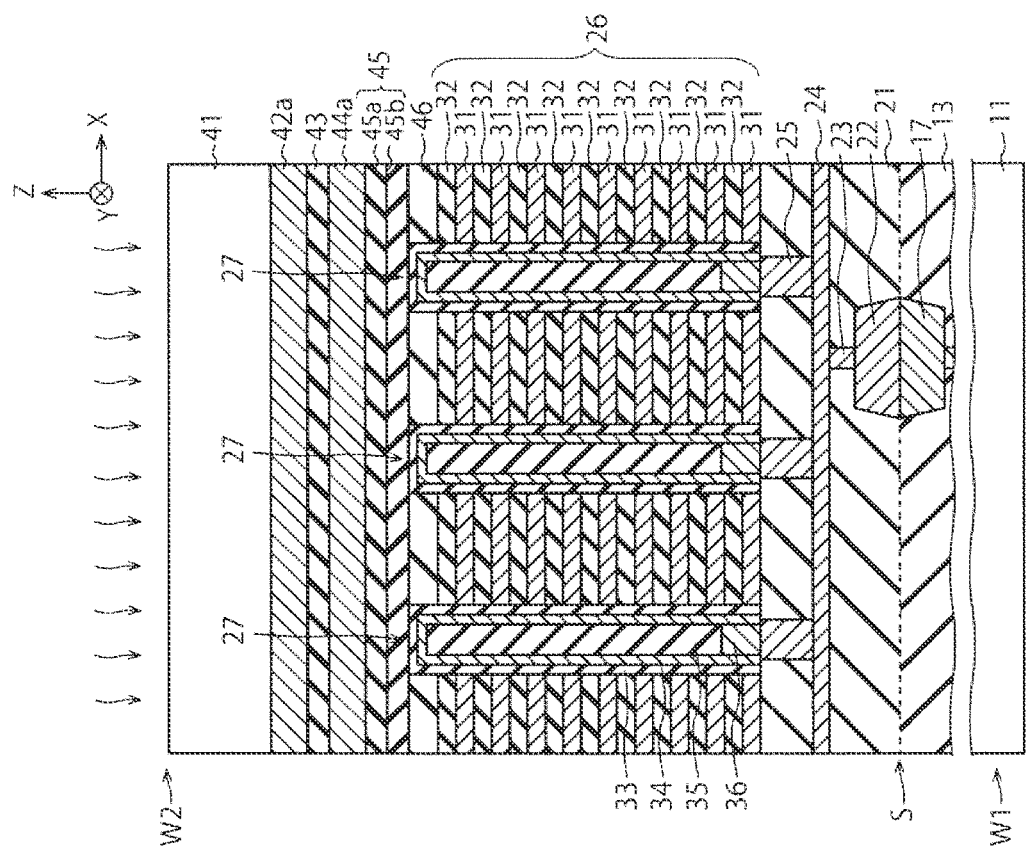
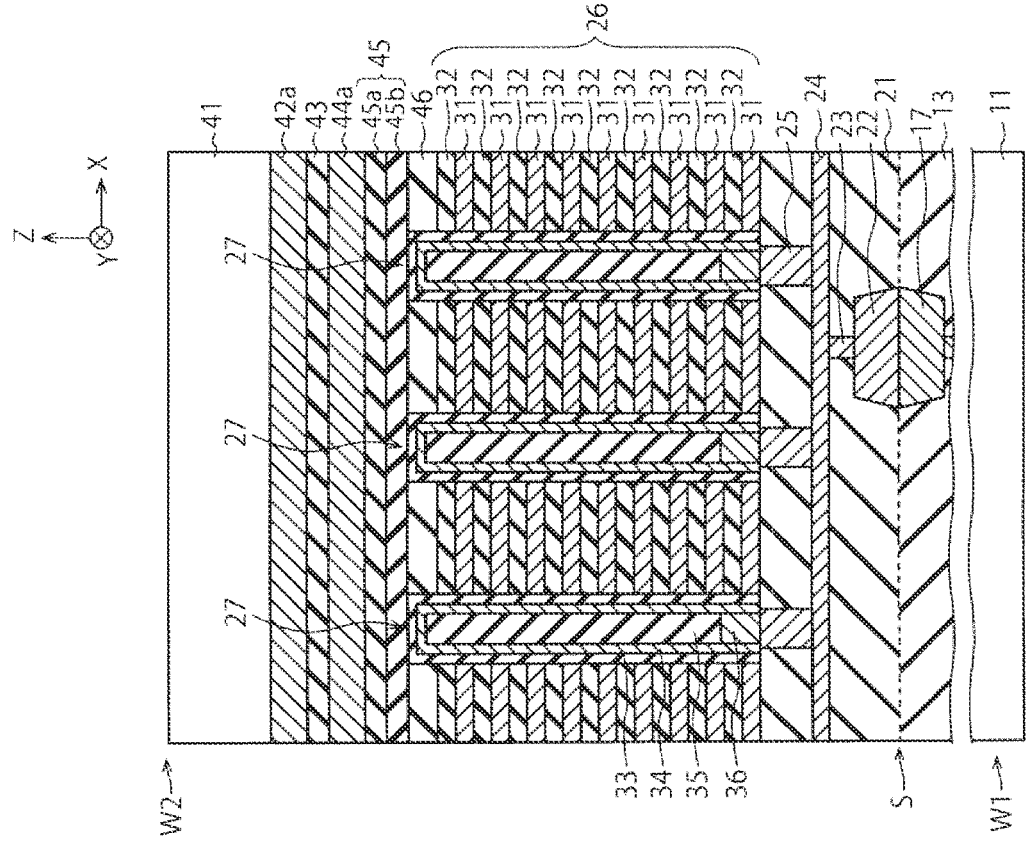

SEMICONDUCTOR DEVICE, SEMICONDUCTOR DEVICE MANUFACTURING METHOD, AND SUBSTRATE REUSING METHOD

CROSS-REFERENCE TO RELATED APPLICATION(S)

This application is based upon and claims the benefit of priority from Japanese Patent Application No. 2021-152458, filed Sep. 17, 2021, the entire contents of which are incorporated herein by reference.

FIELD

Embodiments described herein relate generally to a semiconductor device, a semiconductor device manufacturing method, and a substrate reusing method.

BACKGROUND

When a semiconductor device is manufactured by bonding a certain substrate to another substrate, the substrates may be later separated. In this case, it is desired to adopt a method capable of appropriately separating the substrates.

DESCRIPTION OF THE DRAWINGS

FIGS. 5A and 5B are cross-sectional views (1/5) showing details of the semiconductor device manufacturing method according to the first embodiment.

FIGS. 7A and 7B are cross-sectional views (3/5) showing the details of the semiconductor device manufacturing method according to the first embodiment.

DETAILED DESCRIPTION

Embodiments provide a semiconductor device, a semiconductor device manufacturing method, and a substrate reusing method capable of appropriately separating substrates after being bonded.

In general, according to one embodiment, a semiconductor device manufacturing method includes forming a first film containing a first device on a first substrate, forming a second film containing a semiconductor layer on a second substrate, and changing the semiconductor layer into a porous layer. The method further includes forming a third film containing a second device on the second film, and bonding the first substrate and the second substrate to sandwich the first film, the third film, and the second film therebetween. The method further includes separating the first substrate and the second substrate from each other at a position of the second film.

Hereinafter, embodiments of the present disclosure will be described with reference to the drawings. In FIGS. 1 to 16C, the same components are denoted by the same reference symbols, and redundant description will be omitted.

First Embodiment

Figure 1:
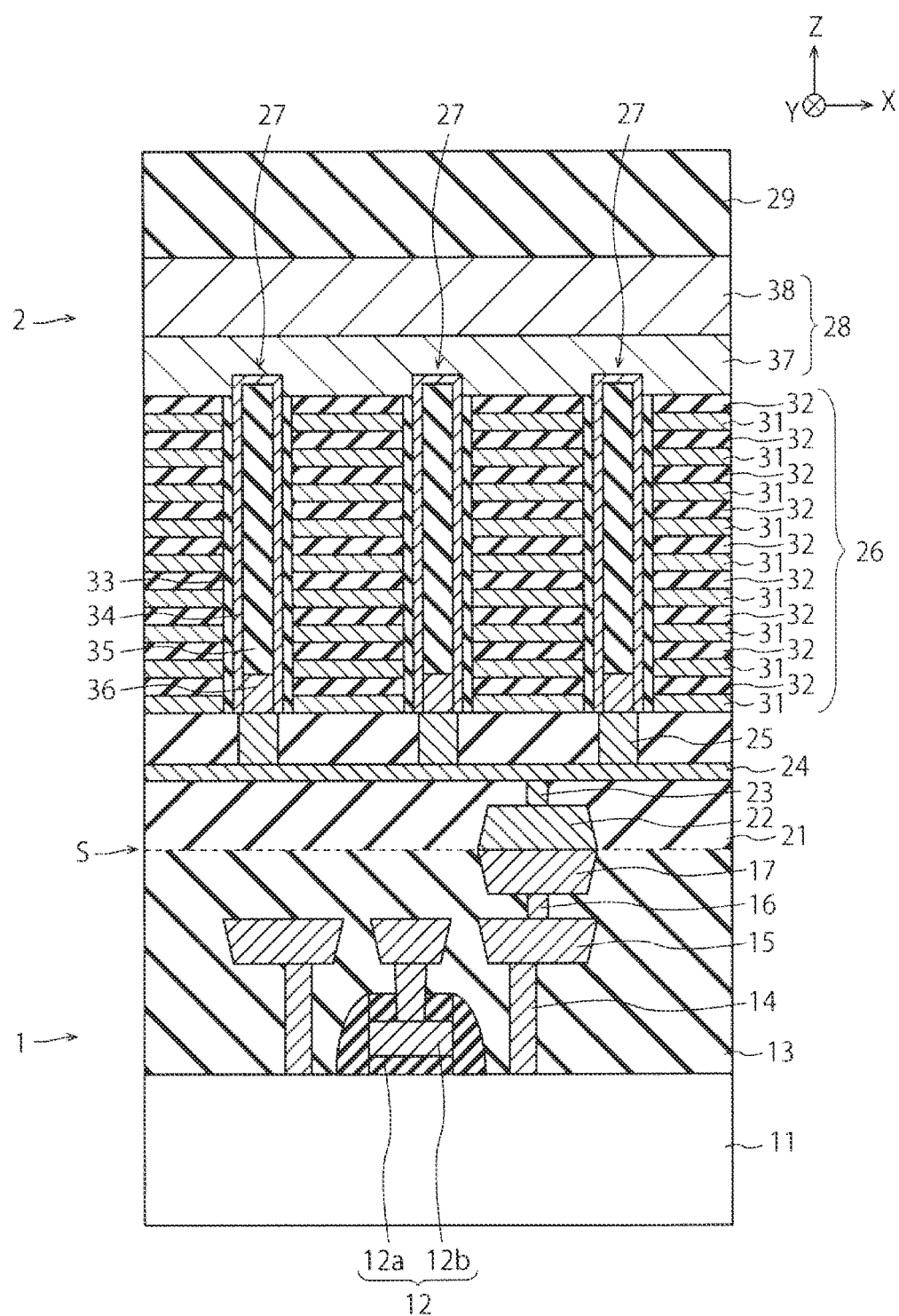
FIG. 1 is a cross-sectional view showing a structure of a semiconductor device according to a first embodiment.

FIG. 1 is a cross-sectional view showing a structure of a semiconductor device according to a first embodiment. The semiconductor device of FIG. 1 is, for example, a three-dimensional flash memory.

The semiconductor device of FIG. 1 includes a circuit area 1 including a Complementary Metal Oxide Semiconductor (CMOS) circuit and an array area 2 including a memory cell array. The memory cell array includes a plurality of memory cells that stores data, and the CMOS circuit includes a peripheral circuit that controls an operation of the memory cell array. The memory cell array and the CMOS circuit are examples of first and second devices. The semiconductor device of FIG. 1 is manufactured, for example, by bonding a circuit wafer including the circuit area 1 and an array wafer including the array area 2, as will be described later. A bonding surface between the circuit area 1 and the array area 2 is indicated by reference symbol S.

FIG. 1 shows X, Y, and Z directions perpendicular to each other. In this specification, a +Z direction is treated as an upward direction, and a −Z direction is treated as a downward direction. For example, the CMOS area 1 is located below the array area 2 because it is shown in the −Z direction of the array area 2. The −Z direction may coincide with a gravity direction or may not coincide with the gravity direction.

In FIG. 1, the circuit area 1 includes a substrate 11, a transistor 12, an interlayer insulating film 13, a plurality of contact plugs 14, a wiring layer 15 including a plurality of wirings, a via plug 16, and a metal pad 17. FIG. 1 shows three of the plurality of wirings in the wiring layer 15 and three contact plugs 14 provided under the wirings. The substrate 11 is an example of a first substrate. The interlayer insulating film 13 is an example of a first film.

In FIG. 1, the array area 2 includes an interlayer insulating film 21, a metal pad 22, a via plug 23, a wiring layer 24 including a plurality of wirings, a plurality of contact plugs 25, a stacked film 26, and a plurality of columnar portions 27, a source layer 28, and an insulating film 29. FIG. 1 shows one of the plurality of wirings in the wiring layer 24, three contact plugs 25 provided on the wiring, and three columnar portions 27. The stacked film 26 is an example of a third film.

Further, as shown in FIG. 1, the stacked film 26 includes a plurality of electrode layers 31 and a plurality of insulating layers 32. Each columnar portion 27 includes a memory insulating film 33, a channel semiconductor layer 34, a core insulating film 35, and a core semiconductor layer 36. The source layer 28 includes a semiconductor layer 37 and a metal layer 38.

Hereinafter, a structure of the semiconductor device according to the present embodiment will be described with reference to FIG. 1.

The substrate 11 is, for example, a semiconductor substrate such as a Si (silicon) substrate. The transistor 12 includes a gate insulating film 12a and a gate electrode 12b formed on the substrate 11 in order, and includes a source diffusion layer and a drain diffusion layer (not shown) formed in the substrate 11. The transistor 12 constitutes, for example, the above-described CMOS circuit. The interlayer insulating film 13 is formed on the substrate 11 to cover the transistor 12. The interlayer insulating film 13 is, for example, a $SiO_2$ film (silicon oxide film) or a stacked film containing the $SiO_2$ film and another insulating film.

The contact plugs 14, the wiring layer 15, the via plug 16, and the metal pad 17 are formed in the interlayer insulating film 13. Specifically, the contact plugs 14 are disposed on the substrate 11 and on the gate electrode 12b of the transistor 12. In FIG. 1, the contact plugs 14 on the substrate 11 are provided on the source diffusion layer and the drain diffusion layer (not shown) of the transistor 12. The wiring layer 15 is disposed on the contact plugs 14, and the via plug 16 is disposed on the wiring layer 15. The metal pad 17 is disposed on the via plug 16 above the substrate 11. The metal pad 17 is, for example, a metal layer including a Cu (copper) layer.

The interlayer insulating film 21 is formed on the interlayer insulating film 13. The interlayer insulating film 21 is, for example, a $SiO_2$ film or a stacked film containing the $SiO_2$ film and another insulating film.

The metal pad 22, the via plug 23, the wiring layer 24, and the contact plugs 25 are formed in the interlayer insulating film 21. Specifically, the metal pad 22 is disposed on the metal pad 17 above the substrate 11. The metal pad 22 is, for example, a metal layer including a Cu layer. The via plug 23 is disposed on the metal pad 22, and the wiring layer 24 is disposed on the via plug 23. FIG. 1 shows one of the plurality of wirings in the wiring layer 24, and the wiring functions as, for example, a bit line. The contact plugs 25 are disposed on the wiring layer 24.

The stacked film 26 is provided on the interlayer insulating film 21, and includes the plurality of electrode layers 31 and the plurality of insulating layers 32 alternately stacked in the Z direction. The electrode layer 31 is, for example, a metal layer including a W (tungsten) layer, and functions as a word line. The insulating layer 32 is, for example, a $SiO_2$ film.

Each columnar portion 27 is provided in the stacked film 26, and includes the memory insulating film 33, the channel semiconductor layer 34, the core insulating film 35, and the core semiconductor layer 36. The memory insulating film 33 is formed on a side surface of the stacked film 26 and has a tubular shape extending in the Z direction. The channel semiconductor layer 34 is formed on a side surface of the memory insulating film 33 and has a tubular shape extending in the Z direction. The core insulating film 35 and the core semiconductor layer 36 are formed on a side surface of the channel semiconductor layer 34 and have a rod-like shape extending in the Z direction. Specifically, the core semiconductor layer 36 is disposed on the contact plug 25, and the core insulating film 35 is disposed on the core semiconductor layer 36.

As will be described later, the memory insulating film 33 includes, for example, a block insulating film, a charge storage layer, and a tunnel insulating film in order. The block insulating film is, for example, a $SiO_2$ film. The charge storage layer is, for example, a SiN film (silicon nitride film). The tunnel insulating film is, for example, a $SiO_2$ film or a SiON film (silicon oxynitride film). The channel semiconductor layer 34 is, for example, a polysilicon layer. The core insulating film 35 is, for example, a $SiO_2$ film. The core semiconductor layer 36 is, for example, a polysilicon layer. Each memory cell in the above-described memory cell array includes the channel semiconductor layer 34, the charge storage layer, the electrode layer 31, and the like.

The channel semiconductor layer 34 and the core semiconductor layer 36 in each columnar portion 27 are electrically connected to the metal pad 22 via the contact plug 25, the wiring layer 24, and the via plug 23. Therefore, the memory cell array in the array area 2 is electrically connected to the peripheral circuit in the circuit area 1 via the metal pad 22 and the metal pad 17. Therefore, it is possible to control the operation of the memory cell array by the peripheral circuit.

The source layer 28 includes the semiconductor layer 37 and the metal layer 38 formed on the stacked film 26 and the columnar portion 27 in order, and functions as a source line. In the present embodiment, the channel semiconductor layer 34 of each columnar portion 27 is exposed from the memory insulating film 33, and the semiconductor layer 37 is formed directly on the channel semiconductor layer 34. Further, the metal layer 38 is formed directly on the semiconductor layer 37. Therefore, the source layer 28 is electrically connected to the channel semiconductor layer 34 and the core semiconductor layer 36 of each columnar portion 27. The semiconductor layer 37 is, for example, a polysilicon layer. The metal layer 38 includes, for example, a W layer, a Cu layer, or an Al (aluminum) layer.

The insulating film 29 is formed on the source layer 28. The insulating film 29 is, for example, a $SiO_2$ film.

Figure 2:
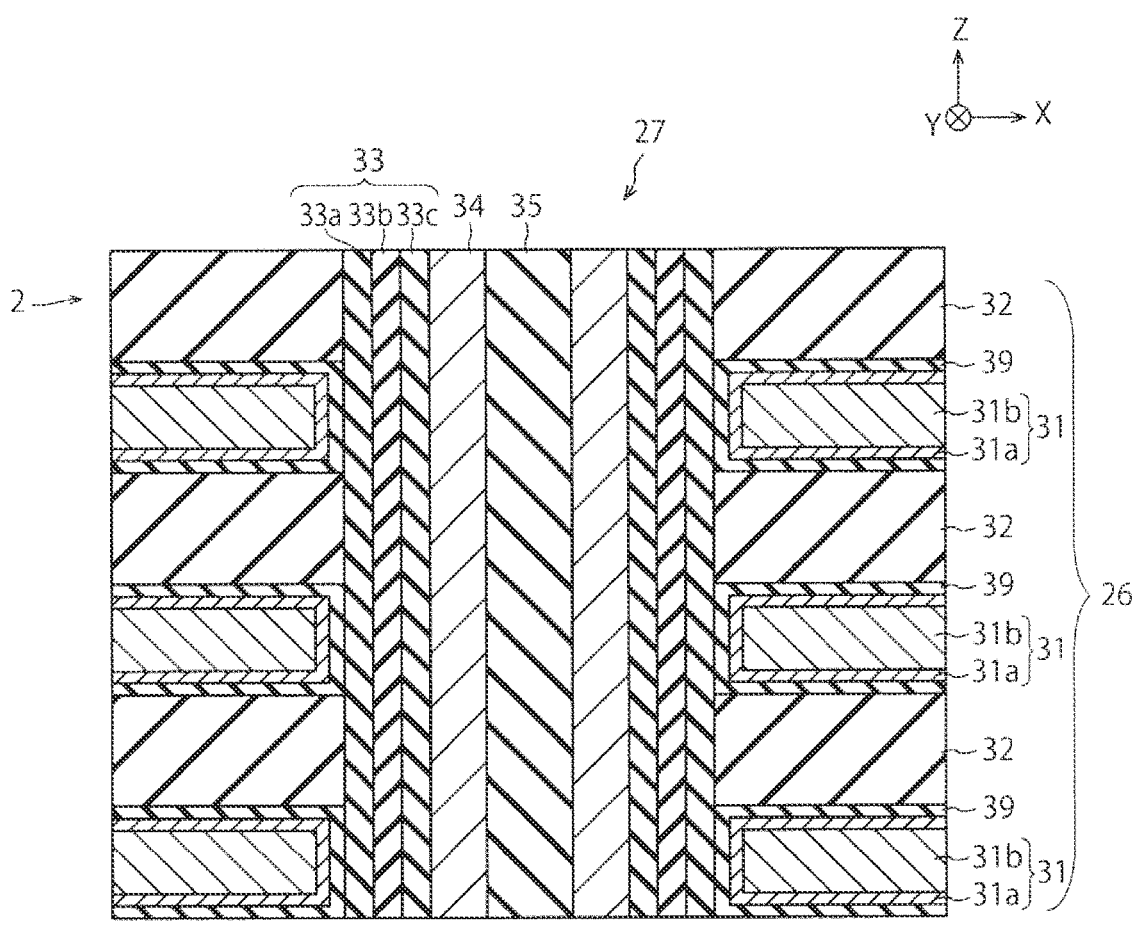
FIG. 2 is an enlarged cross-sectional view showing the structure of the semiconductor device according to the first embodiment.

FIG. 2 is an enlarged cross-sectional view showing the structure of the semiconductor device according to the first embodiment.

FIG. 2 shows three electrode layers 31 and three insulating layers 32, which are provided in the stacked film 26, and one columnar portion 27 provided in the stacked film 26. As described above, the memory insulating film 33 in the columnar portion 27 includes a block insulating film 33a, a charge storage layer 33b, and a tunnel insulating film 33c, which are formed on the side surface of the stacked film 26 in order. The block insulating film 33a is, for example, a $SiO_2$ film. The charge storage layer 33b is, for example, a SiN film. The tunnel insulating film 33c is, for example, a $SiO_2$ film or a SiON film.

On the other hand, each electrode layer 31 includes a barrier metal layer 31a and an electrode material layer 31b.

The barrier metal layer 31a is, for example, a TiN film (titanium nitride film). The electrode material layer 31b is, for example, a W layer. As shown in FIG. 2, each electrode layer 31 according to the present embodiment is formed on a lower surface of the upper insulating layer 32, an upper surface of the lower insulating layer 32, and a side surface of the block insulating film 33a via a block insulating film 39. The block insulating film 39 is, for example, an $Al_2O_3$ film (aluminum oxide film), and functions as the block insulating film of each memory cell together with the block insulating film 33a.

FIGS. 3A to 4C are cross-sectional views showing a semiconductor device manufacturing method according to the first embodiment. The semiconductor device according to the present embodiment is manufactured by bonding a circuit wafer W1 and an array wafer W2, which will be described later. The circuit wafer W1 is used to manufacture the circuit area 1, and the array wafer W2 is used to manufacture the array area 2.

Figure 3A:
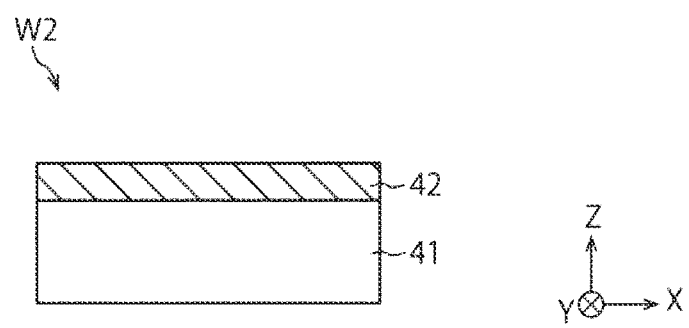
FIGS. 3A to 3C are cross-sectional views (1/2) showing a semiconductor device manufacturing method according to the first embodiment.

First, a substrate 41 for the array wafer W2 is prepared (FIG. 3A). The substrate 41 is, for example, a semiconductor substrate such as a Si substrate. The substrate 41 is an example of a second substrate.

Next, a semiconductor layer 42 is formed on the substrate 41 (FIG. 3A). The semiconductor layer 42 is, for example, an amorphous semiconductor layer such as an amorphous Si layer. The semiconductor layer 42 according to the present embodiment contains a high concentration of impurity atoms. The impurity atom is, for example, a hydrogen (H) atom. For example, an H atom concentration in the semiconductor layer 42 according to the present embodiment is equal to or higher than concentration $1.0 \times 10^{21}/cm^3$. The impurity atom may be an atom other than the H atom, and may be a noble gas atom such as a helium (He) atom. The semiconductor layer 42 is an example of a first semiconductor layer in a second film.

Figure 3B:
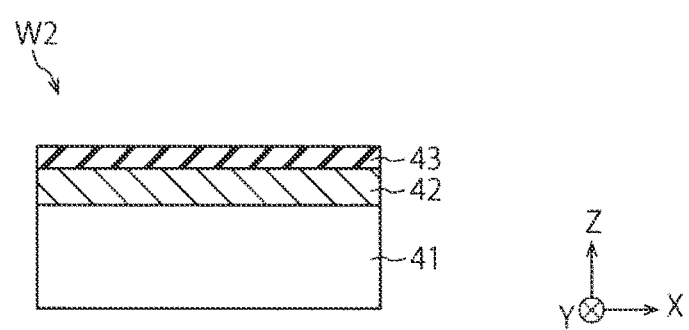

Next, a dummy insulating film 43 is formed on the semiconductor layer 42 (FIG. 3B). The dummy insulating film 43 is, for example, a $SiO_2$ film, and is formed by Chemical Vapor Deposition (CVD) or low-temperature radical oxidation. The dummy insulating film 43 according to the present embodiment is in contact with the semiconductor layer 42. The dummy insulating film 43 is an example of a first insulating film in the second film.

Figure 3C:
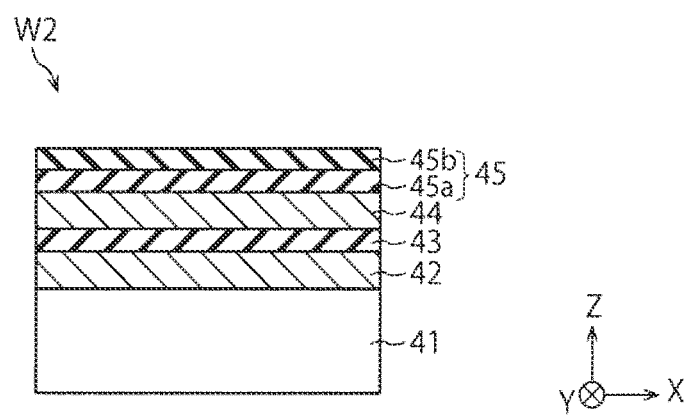

Next, a semiconductor layer 44 is formed on the dummy insulating film 43 (FIG. 3C). The semiconductor layer 44 is, for example, an amorphous semiconductor layer such as an amorphous Si layer. The semiconductor layer 44 according to the present embodiment contains a high concentration of impurity atoms. This impurity atom is, for example, an H atom. For example, an H atom concentration in the semiconductor layer 44 according to the present embodiment is equal to or higher than $1.0 \times 10^{21}/cm^3$. The impurity atoms may be atoms other than the H atoms, and may be the noble gas atoms such as the He atoms. The semiconductor layer 44 according to the present embodiment is in contact with the dummy insulating film 43. The semiconductor layer 44 is an example of a second semiconductor layer in the second film.

Next, a cap insulating film 45 is formed on the semiconductor layer 44 (FIG. 3C). The cap insulating film 45 includes an insulating film 45a formed on the semiconductor layer 44 and an insulating film 45b formed on the insulating film 45a. The insulating film 45a is, for example, a $SiO_2$ film. The insulating film 45b is, for example, a SiN film. The cap insulating film 45 is an example of a second insulating film. The insulating film 45a is an example of a third insulating film. The insulating film 45b is an example of a fourth insulating film.

Figure 4A:
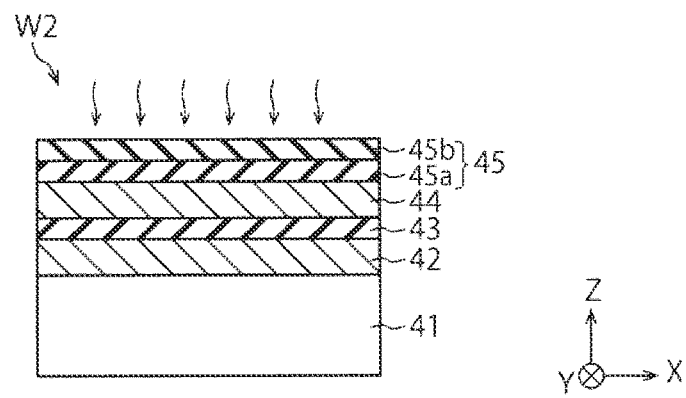
FIGS. 4A to 4C are cross-sectional views (2/2) showing the semiconductor device manufacturing method according to the first embodiment.
Figure 4B:
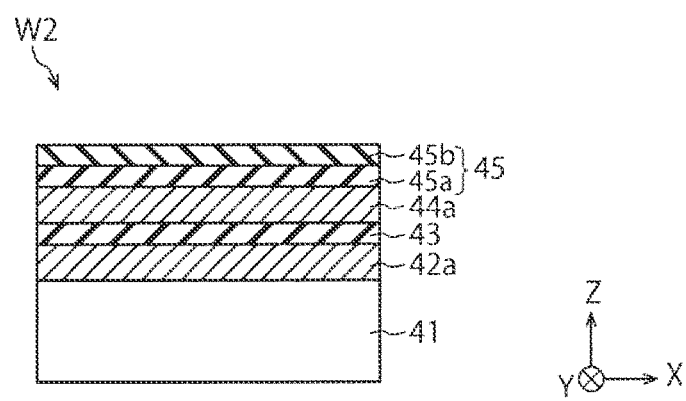

Next, laser annealing of the array wafer W2 is performed (FIG. 4A). As a result, the semiconductor layers 42 and 44 are heated and melted. A melting temperature of the semiconductor layers 42 and 44 is equal to or higher than, for example, 1300° C. Thereafter, the semiconductor layers 42 and 44 are crystallized and changed into semiconductor layers 42a and 44a, respectively (FIG. 4B). The semiconductor layers 42a and 44a are, for example, porous semiconductor layers such as a porous poly Si layer. The semiconductor layers 42 and 44 according to the present embodiment made at time of are porous the crystallization, thereby being changed into a porous poly Si layer which is the poly Si layer and a porous layer.

The laser annealing according to the present embodiment is performed using, for example, ultraviolet light (UV light). Therefore, it is possible to change the semiconductor layers 42 and 44 into the semiconductor layers 42a and 44a, respectively. An intensity of UV light is set to, for example, 0.3 to 2.0 $J/cm^2$. The laser annealing according to the present embodiment may be performed using laser light other than UV light, or may be performed using, for example, light having a wavelength equal to or lower than a wavelength of visible light.

Being made porous according to the present embodiment occurs when impurity atoms in the semiconductor layers 42 and 44 gather to form a large number of voids (porous) such as bubbles. When the cap insulating film 45 is not formed on the semiconductor layer 44, the voids may deteriorate roughness of an upper surface of the semiconductor layer 44. According to the present embodiment, when the laser annealing is performed after forming the cap insulating film 45 on the semiconductor layer 44, it is possible to prevent deterioration of the roughness of the upper surface of the semiconductor layer 44. Since a melting point of the SiN film is higher than a melting point of the $SiO_2$ film, the insulating film 45b (SiN film) can effectively prevent the deterioration of roughness due to voids. On the other hand, the insulating film 45a ($SiO_2$ film) is effective for adjusting a reflectance of the laser light. Therefore, the cap insulating film 45 according to the present embodiment includes the insulating film 45a and the insulating film 45b. When it is not necessary to adjust the reflectance of the laser light, the cap insulating film 45 may include only the insulating film 45b.

It is also conceivable that the semiconductor layers 42 and 44 are made porous by, for example, a wet treatment such as anodic oxidation. However, the wet treatment cannot be performed after the cap insulating film 45 is formed on the semiconductor layer 44, so that the deterioration of roughness may not be prevented. Therefore, it is desirable that the semiconductor layers 42 and 44 be made porous by the laser annealing.

In the present embodiment, both the semiconductor layers 42 and 44 are made porous. Instead, only one of the semiconductor layers 42 and 44 may be made porous. For example, only the semiconductor layer 44 may be made porous when only the semiconductor layer 44 is sufficiently heated. Further, the laser annealing according to the present embodiment is performed so that the entire semiconductor layer 42 is made porous. Instead, the laser annealing may be performed so that only a part of the semiconductor layer 42 is made porous. In the same manner, the laser annealing according to the present embodiment is performed so that the entire semiconductor layer 44 is made porous. Instead, the laser annealing may be performed so that only a part of the semiconductor layer 44 is made porous. Therefore, in a step shown in FIG. 4B, the entire semiconductor layers 42 and 44 may be melted, or only a part of the semiconductor layers 42 and 44 may be melted.

Figure 4C:
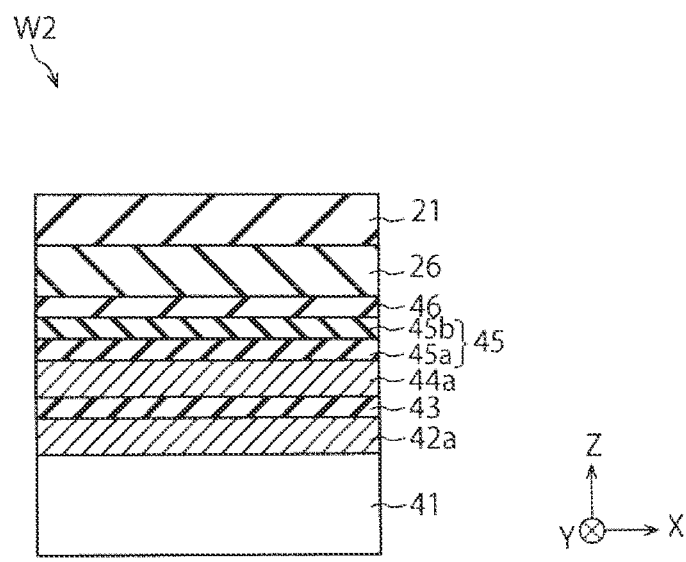

Next, the insulating film 46, the stacked film 26, and the interlayer insulating film 21 are formed on the cap insulating film 45 in order (FIG. 4C). The insulating film 46 is, for example, a $SiO_2$ film. The details of the stacked film 26 and the interlayer insulating film 21 are as described above with reference to FIG. 1. FIG. 4C schematically shows structures of the stacked film 26 and the interlayer insulating film 21. A step shown in FIG. 4C and subsequent steps will be described later with reference to FIGS. 5A to 9B.

FIGS. 5A to 9B are cross-sectional views showing the details of the semiconductor device manufacturing method according to the first embodiment.

FIGS. 5A to 6B show the details of the step shown in FIG. 4C. First, the insulating film 46 is formed on the cap insulating film 45, and a stacked film 26' is formed on the insulating film 46 (FIG. 5A). The stacked film 26' is a film for forming the stacked film 26 by a replacement treatment. The stacked film 26' alternately include a plurality of sacrificial layers 31' and the plurality of insulating layers 32. The sacrificial layer 31' is, for example, a SiN film.

Next, a plurality of memory holes H1 penetrating the stacked film 26' and the insulating film 46 are formed, and the memory insulating film 33, the channel semiconductor layer 34, and the core insulating film 35 are formed in each of the memory holes H1 in order (FIG. 5A). As a result, the plurality of columnar portions 27 extending in the Z direction are formed in the memory holes H1. The memory insulating film 33 is formed by forming the block insulating film 33a, the charge storage layer 33b, and the tunnel insulating film 33c in each memory hole H1 in order (see FIG. 2).

Next, an insulating film 47 is formed on the stacked film 26' and the columnar portions 27 (FIG. 5A). The insulating film 47 is, for example, a $SiO_2$ film.

Next, a slit (not shown) penetrating the insulating film 47 and the stacked film 26' is formed, and the sacrificial layer 31' is removed by wet etching using the slit (FIG. 5B). As a result, a plurality of cavities H2 are formed between the insulating layers 32 in the stacked film 26'.

Figure 6A:
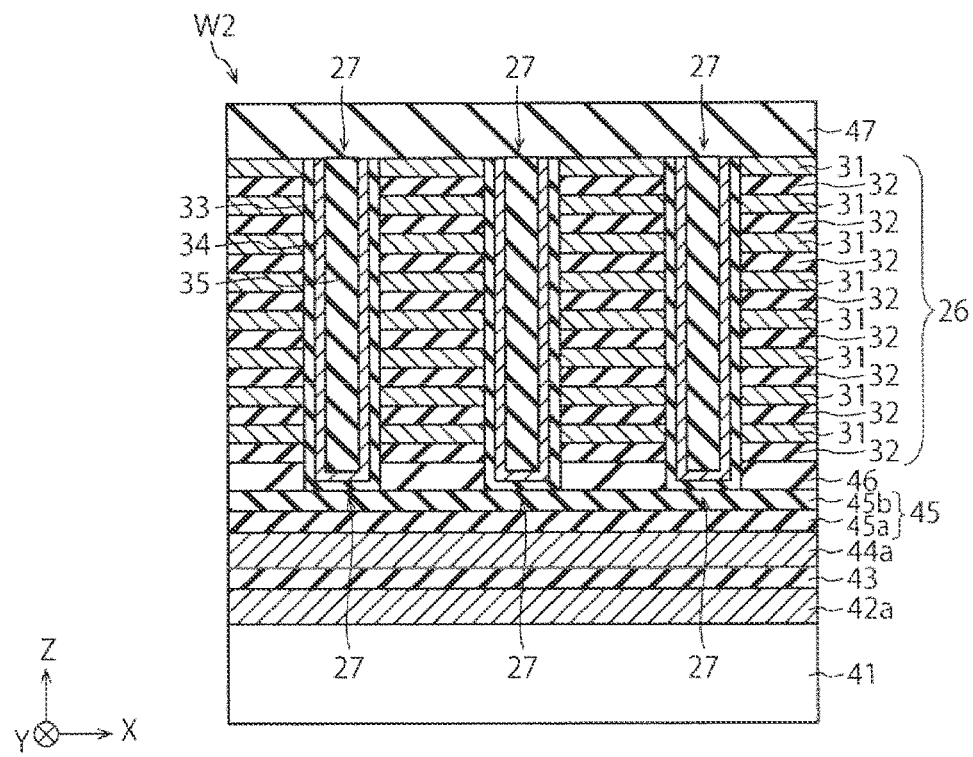
FIGS. 6A and 6B are cross-sectional views (2/5) showing the details of the semiconductor device manufacturing method according to the first embodiment.

Next, the plurality of electrode layers 31 are formed in the cavities H2 from the slits (FIG. 6A). As a result, the stacked film 26, which includes the plurality of electrode layers 31 and the plurality of insulating layers 32 alternately, is formed between the insulating film 46 and the insulating film 47 (replacement treatment). Further, a structure, in which the plurality of columnar portions 27 penetrate the stacked film 26, is formed above the substrate 41. When the electrode layer 31 is formed in each cavity H2, the block insulating film 39, the barrier metal layer 31a, and the electrode material layer 31b are formed in each cavity H2 in order (see FIG. 2).

Figure 6B:
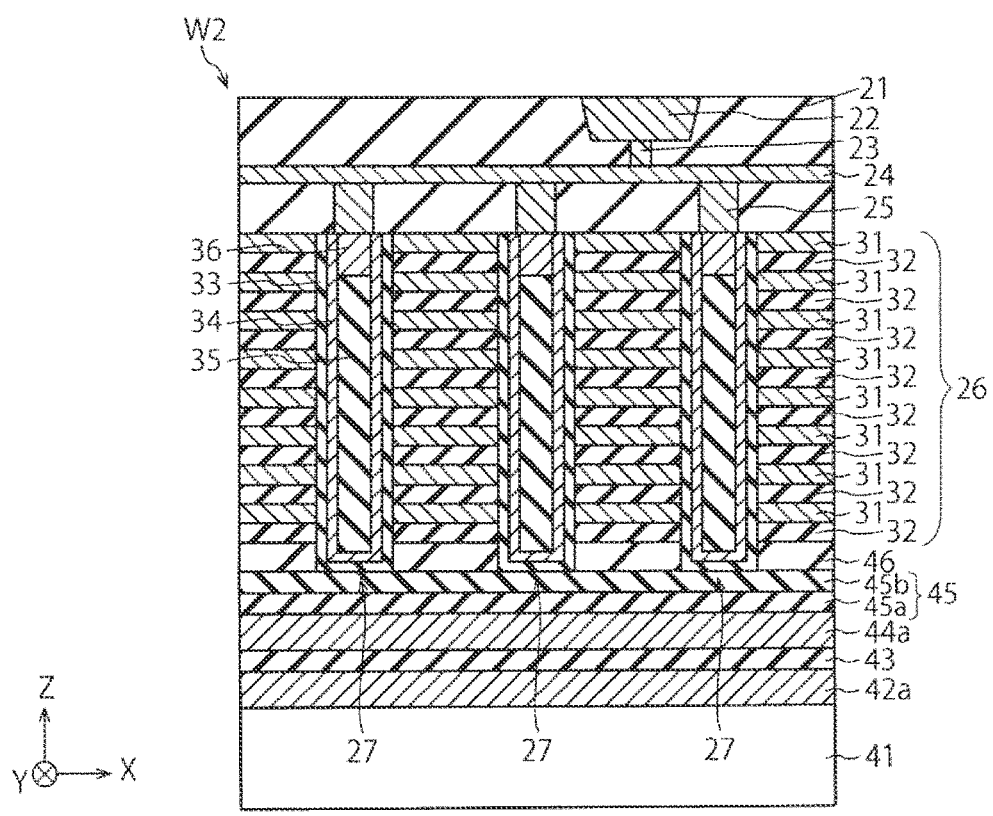

Next, the insulating film 47 is removed, a part of the core insulating film 35 in each columnar portion 27 is removed, and the core semiconductor layer 36 is embedded in an area from which a part of the core insulating film 35 is removed (FIG. 6B). As a result, each columnar portion 27 is processed into a structure including the memory insulating film 33, the channel semiconductor layer 34, the core insulating film 35, and the core semiconductor layer 36.

Next, the interlayer insulating film 21, the metal pad 22, the via plug 23, the wiring layer 24, and the plurality of contact plugs 25 are formed on the stacked film 26 and the columnar portion 27 (FIG. 6B). At this time, each of the contact plugs 25 is formed on the core semiconductor layers 36 of the corresponding columnar portion 27, and the wiring layer 24, the via plug 23, and the metal pad 22 are formed on the contact plugs 25 in order. FIG. 6B shows the same state as shown in FIG. 4B.

FIG. 7A shows a step (bonding step) of bonding the circuit wafer W1 and the array wafer W2. The circuit wafer W1 shown in FIG. 7A is manufactured by preparing the substrate 11 and forming the transistor 12, the interlayer insulating film 13, the plurality of contact plugs 14, the wiring layer 15, the via plug 16, and the metal pad 17 on the substrate 11 (see FIG. 1). At this time, the transistor 12 is formed on the substrate 11, and the contact plugs 14 are formed on the substrate 11 and the transistor 12. Further, the wiring layer 15, the via plug 16, and the metal pad 17 are formed on the contact plugs 14 in order.

Next, the orientation of the array wafer W2 is reversed, and the circuit wafer W1 and the array wafer W2 are bonded by mechanical pressure (FIG. 7A). As a result, the interlayer insulating film 13 and the interlayer insulating film 21 are adhered to each other. Next, the circuit wafer W1 and the array wafer W2 are annealed (FIG. 7A). As a result, the metal pad 17 and the metal pad 22 are joined. In this way, the substrate 11 and the substrate 41 are bonded to sandwich the interlayer insulating films 13 and 21, the stacked film 26, the insulating film 46, the cap insulating film 45, the semiconductor layer 44a, the dummy insulating film 43, and the semiconductor layer 42a therebetween, so that the substrate 41 is stacked above the substrate 11.

Figure 8A:
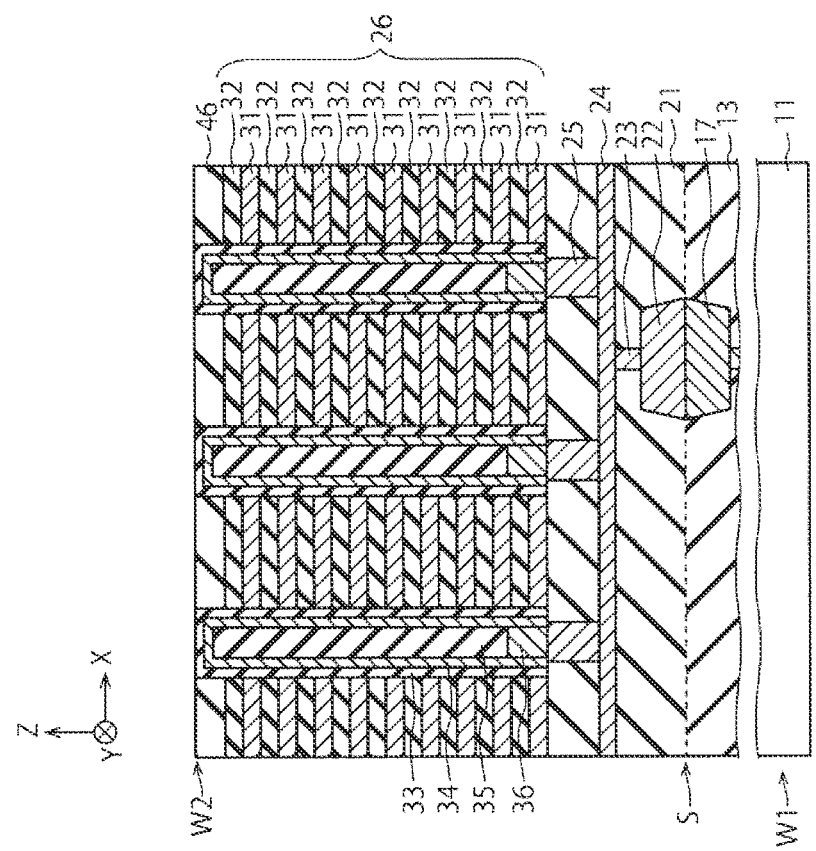
FIGS. 8A and 8B are cross-sectional views (4/5) showing the details of the semiconductor device manufacturing method according to the first embodiment.

Next, the array wafer W2 is irradiated with a laser (FIG. 7B). The laser contains, for example, infrared light. In a step shown in FIG. 7B, the dummy insulating film 43 irradiated with the laser generates heat (ablation), and the heat can induce stress to the semiconductor layers 42a and 44a. As a result, the semiconductor layer 42a, the dummy insulating film 43, or the semiconductor layer 44a is broken. As a result, the substrate 11 and the substrate 41 can be separated from each other (FIG. 8A). In FIG. 8A, since the semiconductor layer 42a is broken, the substrate 11 and the substrate 41 are separated at a position of the semiconductor layer 42a. As a result, a part of the semiconductor layer 42a remains on a front surface of the substrate 41, and a remaining part of the semiconductor layer 42a remains on a front surface of the substrate 11. Further, the above-described memory cell array and the CMOS circuit also remain on the front surface of the substrate 11.

It is desirable that the heat generated in the dummy insulating film 43 is easily transferred to the semiconductor layers 42a and 44a. Therefore, it is desirable that the semiconductor layers 42a and 44a are in contact with the dummy insulating film 43. In the present embodiment, when the heat from the dummy insulating film 43 is transferred to the semiconductor layers 42a and 44a, stress can be applied to the semiconductor layers 42a and 44a.

The semiconductor layers 42a and 44a according to the present embodiment are porous semiconductor layers containing a large number of voids, thereby being easily cracked. Therefore, when stress is applied to the semiconductor layers 42a and 44a, the semiconductor layer 42a or the semiconductor layer 44a can be broken. In general, the higher the concentration of impurity atoms in the semiconductor layers 42a and 44a, the larger the number of voids generated in the semiconductor layers 42a and 44a, so that the semiconductor layers 42a and 44a are more easily cracked. Therefore, it is desirable to set the concentration of impurity atoms in the semiconductor layers 42a and 44a to be high, and it is desirable to set the concentration of impurity atoms, for example, to be equal to or higher than $1.0\times10^{21}/cm^3$. The impurity atom is, for example, the H atom or the noble gas atom (for example, the He atom) as described above. The substrate 11 and the substrate 41 may be separated by breaking the dummy insulating film 43 instead of breaking the semiconductor layers 42a and 44a. The semiconductor layer 42a, the dummy insulating film 43, and the semiconductor layer 44a according to the present embodiment function as a separation layer (peeling layer) for separating (peeling) the substrate 41 from the substrate 11.

The heat generated in the dummy insulating film 43 is generally transferred to an upper side and a lower side of the dummy insulating film 43. Therefore, the array wafer W2 shown in FIG. 8A includes the semiconductor layer 42a on an upper surface of the dummy insulating film 43 and includes the semiconductor layer 44a on a lower surface of the dummy insulating film 43. Therefore, it is possible to efficiently utilize the heat generated in the dummy insulating film 43. On the other hand, the array wafer W2 according to the present embodiment may include only one of the semiconductor layers 42a and 44a.

In the present embodiment, the substrate 41 above the substrate 11 is removed by peeling the substrate 41 from the substrate 11 instead of scraping the substrate 41. As a result, it is possible to prevent damage from being applied to the substrate 41, and it is possible to reuse the substrate 41. In the present embodiment, after the substrate 11 and the substrate 41 are separated from each other, the semiconductor layer 42a and the like remaining on the front surface of the substrate 41 are removed, and the substrate 41 is reused in the bonding step shown in FIG. 7A. Therefore, it is possible to avoid waste of using a large number of substrates 41.

Figure 8B:
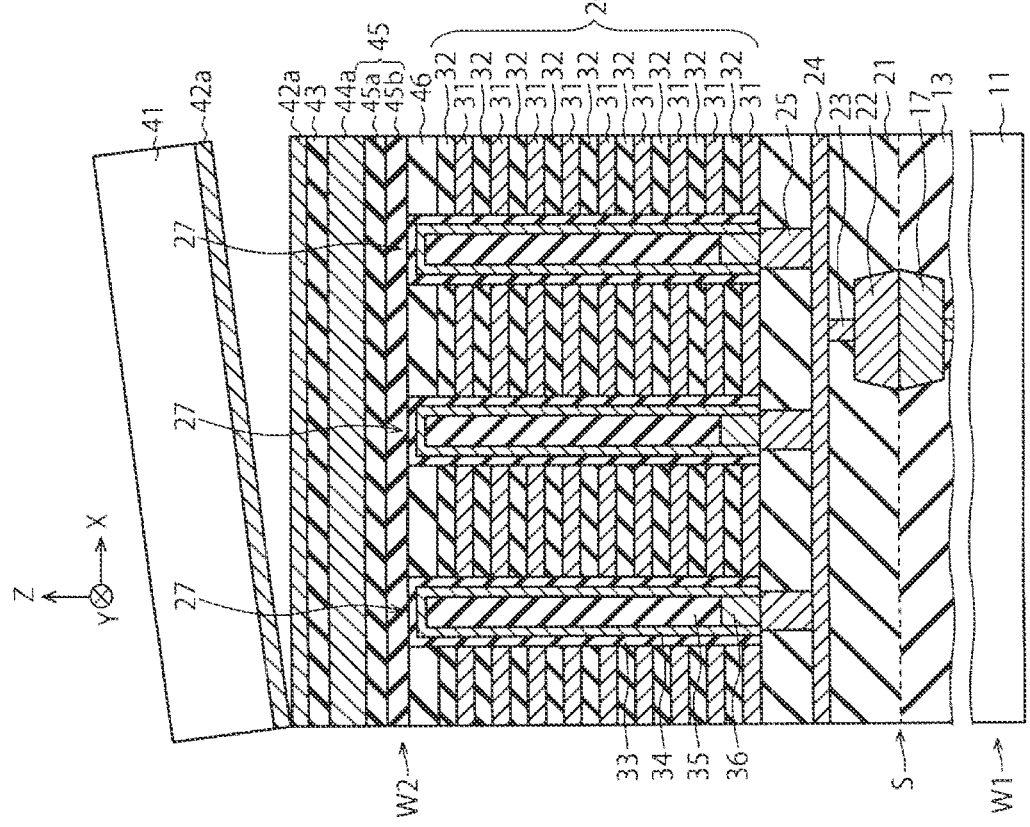

Next, the semiconductor layer 42a, the dummy insulating film 43, the semiconductor layer 44a, and the cap insulating film 45 above the substrate 11 are removed (FIG. 8B). As a result, the insulating film 46 and each columnar portion 27 are exposed above the substrate 11. A step shown in FIG. 8B is performed by, for example, Chemical Mechanical Polishing (CMP) or etching. In the step of FIG. 8B, the substrate 11 may be further thinned by CMP or etching.

Figures 9A, 9B:
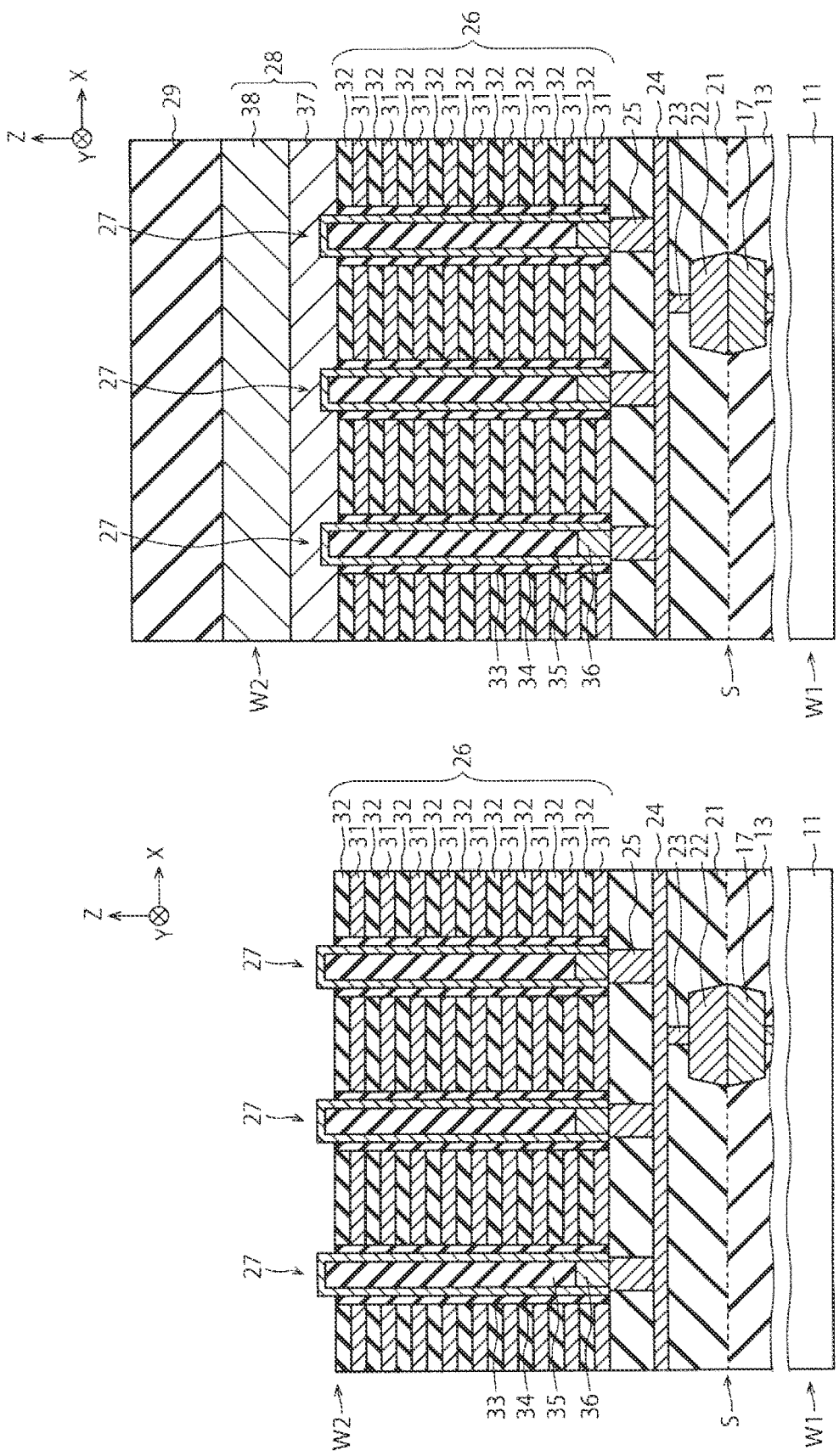
FIGS. 9A and 9B are cross-sectional views (5/5) showing the details of the semiconductor device manufacturing method according to the first embodiment.

Next, the insulating film 46 or a part of the memory insulating film 33 of each columnar portion 27 is removed by etching (FIG. 9A). A portion of the memory insulating film 33 to be removed is, for example, a portion exposed from the stacked film 26. As a result, a part of the channel semiconductor layer 34 of each columnar portion 27 is exposed from the memory insulating film 33 at a position higher than the stacked film 26.

Next, the semiconductor layer 37, the metal layer 38, and the insulating film 29 are formed on the stacked film 26 and the columnar portion 27 in order (FIG. 9B). As a result, the source layer 28 is formed on the channel semiconductor layer 34 of each columnar portion 27 and is electrically connected to the channel semiconductor layer 34 of each columnar portion 27.

After that, the circuit wafer W1 and the array wafer W2 are cut into a plurality of chips. The chips are cut so that each chip includes the circuit area 1 and the array area 2. In this way, the semiconductor device of FIG. 1 is manufactured.

The semiconductor device according to the present embodiment may be sold in a state shown in FIG. 1 or may be sold in a state shown in FIG. 7A. In the latter case, a purchaser of the semiconductor device performs the steps shown in FIGS. 7B to 9B and subsequent steps.

Figure 10A:
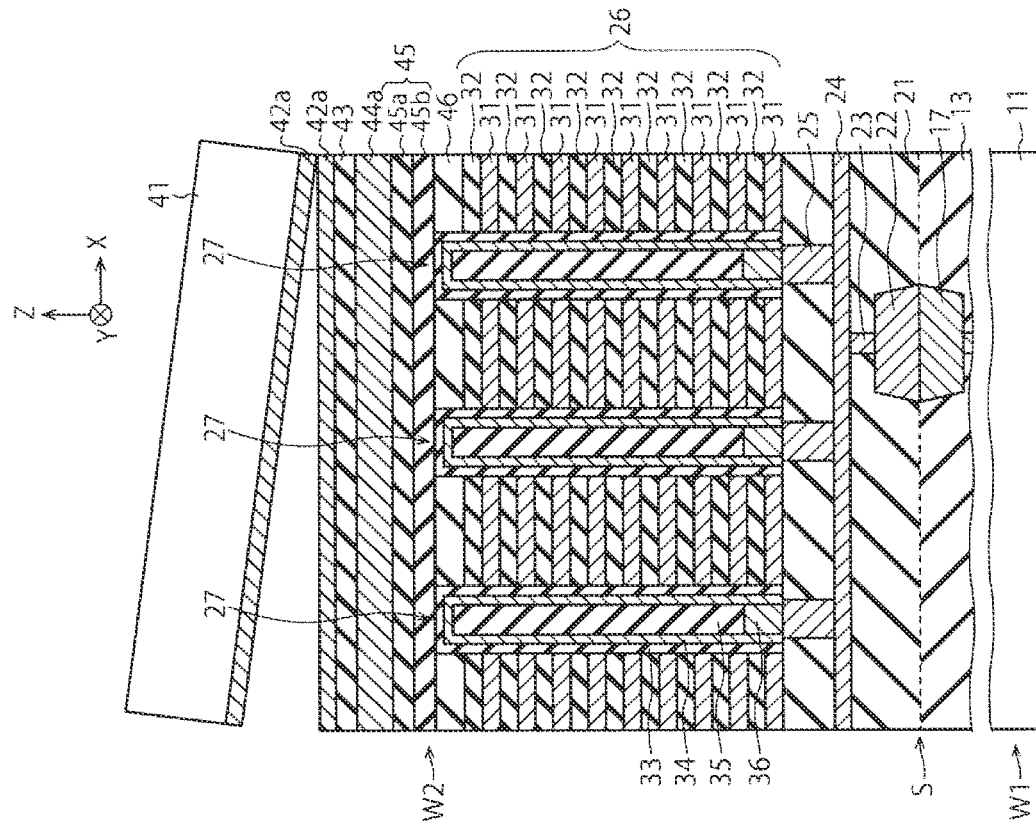
FIGS. 10A and 10B are cross-sectional views showing a semiconductor device manufacturing method according to a modification example of the first embodiment.
Figure 10B:
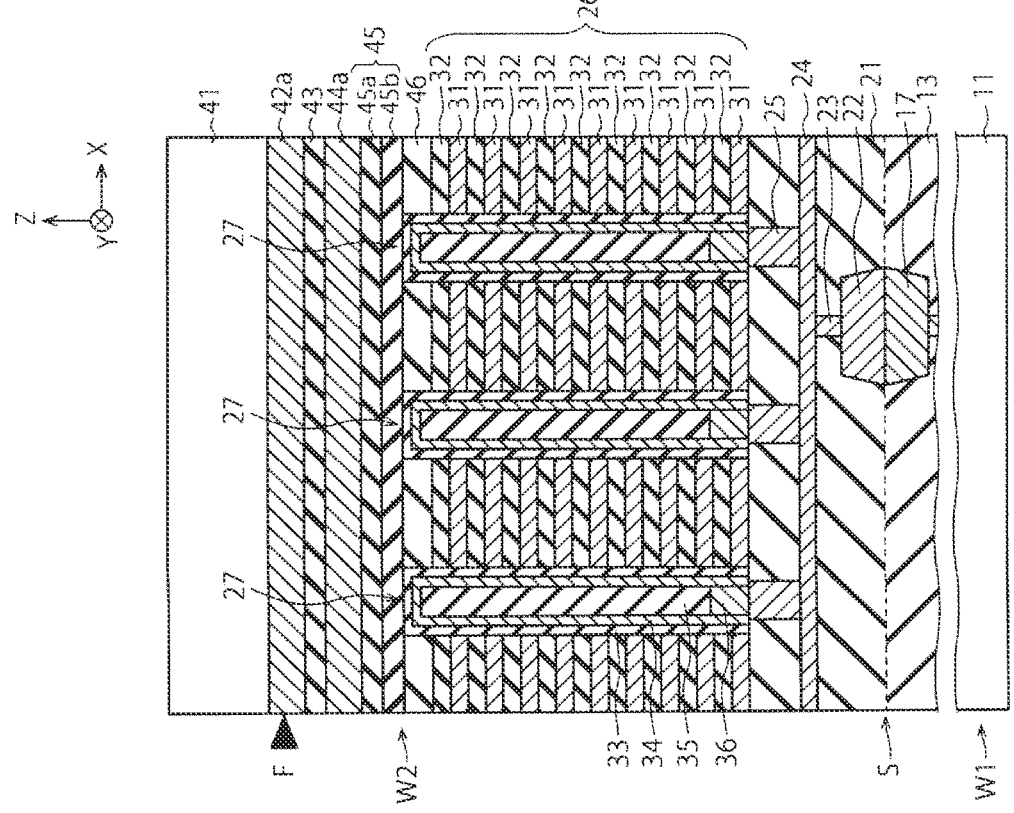

FIGS. 10A and 10B are cross-sectional views showing a semiconductor device manufacturing method according to a modification example of the first embodiment.

FIG. 10A shows a step corresponding to the step shown in FIG. 7B. In the present modification example, instead of irradiating the array wafer W2 with laser, a force F is applied to the array wafer W2 by a blade or a water jet (FIG. 10A). Specifically, the force F is applied to cross sections of the semiconductor layer 42a, the dummy insulating film 43, or the semiconductor layer 44a. As a result, the semiconductor layer 42a, the dummy insulating film 43, or the semiconductor layer 44a is broken. As a result, the substrate 11 and the substrate 41 can be separated from each other (FIG. 10B). In FIGS. 10A and 10B, the force F is applied to a cross section of the semiconductor layer 42a to break the semiconductor layer 42a, so that the substrate 11 and the substrate 41 are separated at the position of the semiconductor layer 42a. As a result, a part of the semiconductor layer 42a remains on a front surface of the substrate 41, and a remaining part of the semiconductor layer 42a remains on a front surface of the substrate 11. Further, the above-described memory cell array and the CMOS circuit also remain on the front surface of the substrate 11.

In the present modification example, the other steps may be performed in the same manner as in the case according to the first embodiment. As a result, the semiconductor device shown in FIG. 1 is manufactured. The array wafer W2 according to the present modification example may not include the dummy insulating film 43. In this case, the array wafer W2 according to the present modification example may not further include one of the semiconductor layers 42a and 44a. Further, the force F may be applied mechanically like the blade, may be applied fluidly like the water jet, or may be applied in other ways.

Figure 11A:
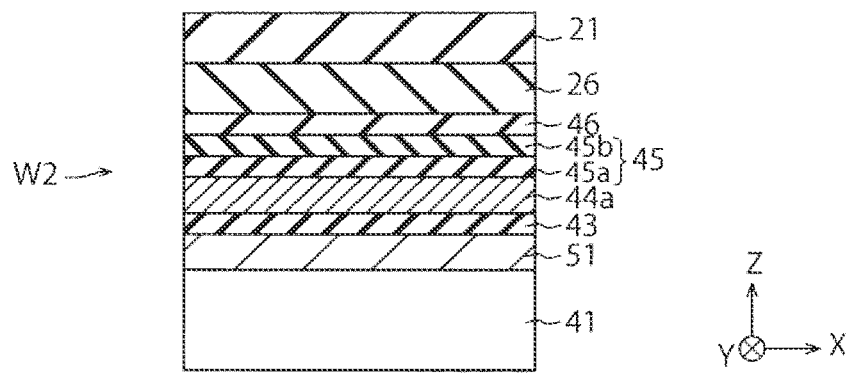
FIGS. 11A to 11C are cross-sectional views showing a semiconductor device manufacturing method according to another modification example of the first embodiment.
Figure 11B:
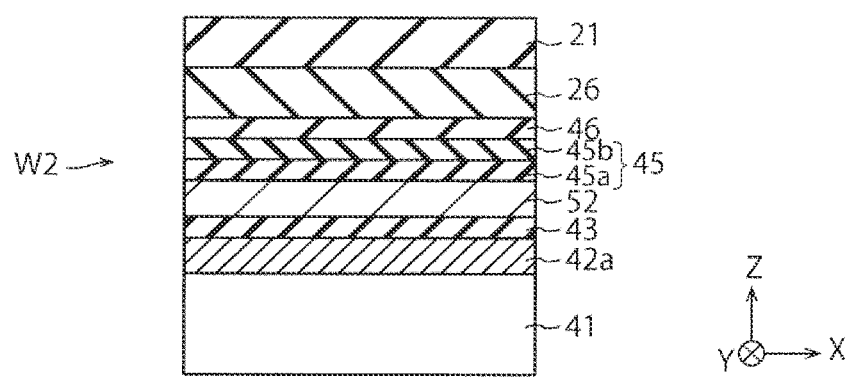
Figure 11C:
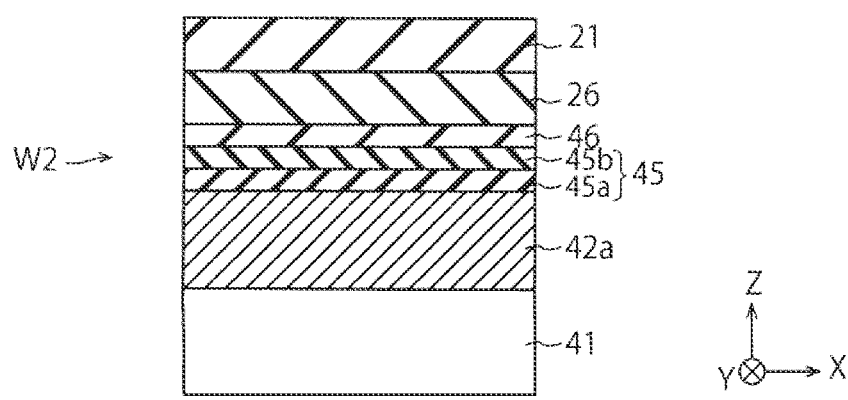

FIGS. 11A to 11C are cross-sectional views showing a semiconductor device manufacturing method according to another modification example of the first embodiment.

FIG. 11A shows a step corresponding to the step shown in FIG. 4C. In the modification example shown in FIG. 11A, the array wafer W2 includes a semiconductor layer 51 instead of the semiconductor layer 42a. The semiconductor layer 51 is, for example, an amorphous Si layer or a poly Si layer other than the porous Si layer. Therefore, in the step shown in FIG. 8A or FIG. 10B, the semiconductor layer 42a is more easily cracked than the semiconductor layer 51.

FIG. 11B also shows a step corresponding to the step shown in FIG. 4C. In the modification example shown in FIG. 11B, the array wafer W2 includes a semiconductor layer 52 instead of the semiconductor layer 44a. The semiconductor layer 52 is, for example, an amorphous Si layer or a poly Si layer other than the porous Si layer. Therefore, in the step shown in FIG. 8A or FIG. 10B, the semiconductor layer 44a is more easily cracked than the semiconductor layer 52.

FIG. 11C also shows a step corresponding to the step shown in FIG. 4C. In the modification example shown in FIG. 11C, the array wafer W2 does not include the dummy insulating film 43 and the semiconductor layer 44a. In the present modification example, when the force F is applied to the semiconductor layer 42a, the steps shown in FIGS. 10A and 10B can be performed. On the other hand, in the present modification example, when the heat is generated in the insulating film 45a instead of the dummy insulating film 43, the steps shown in FIGS. 7B and 8A may be performed.

In the method according to the first embodiment shown in FIGS. 3A to 9B, the step shown in FIG. 4C may be replaced with the step shown in FIG. 11A, 11B, or 11C. This applies to the method according to the modification example shown in FIGS. 10A and 10B in the same manner.

Figure 12:
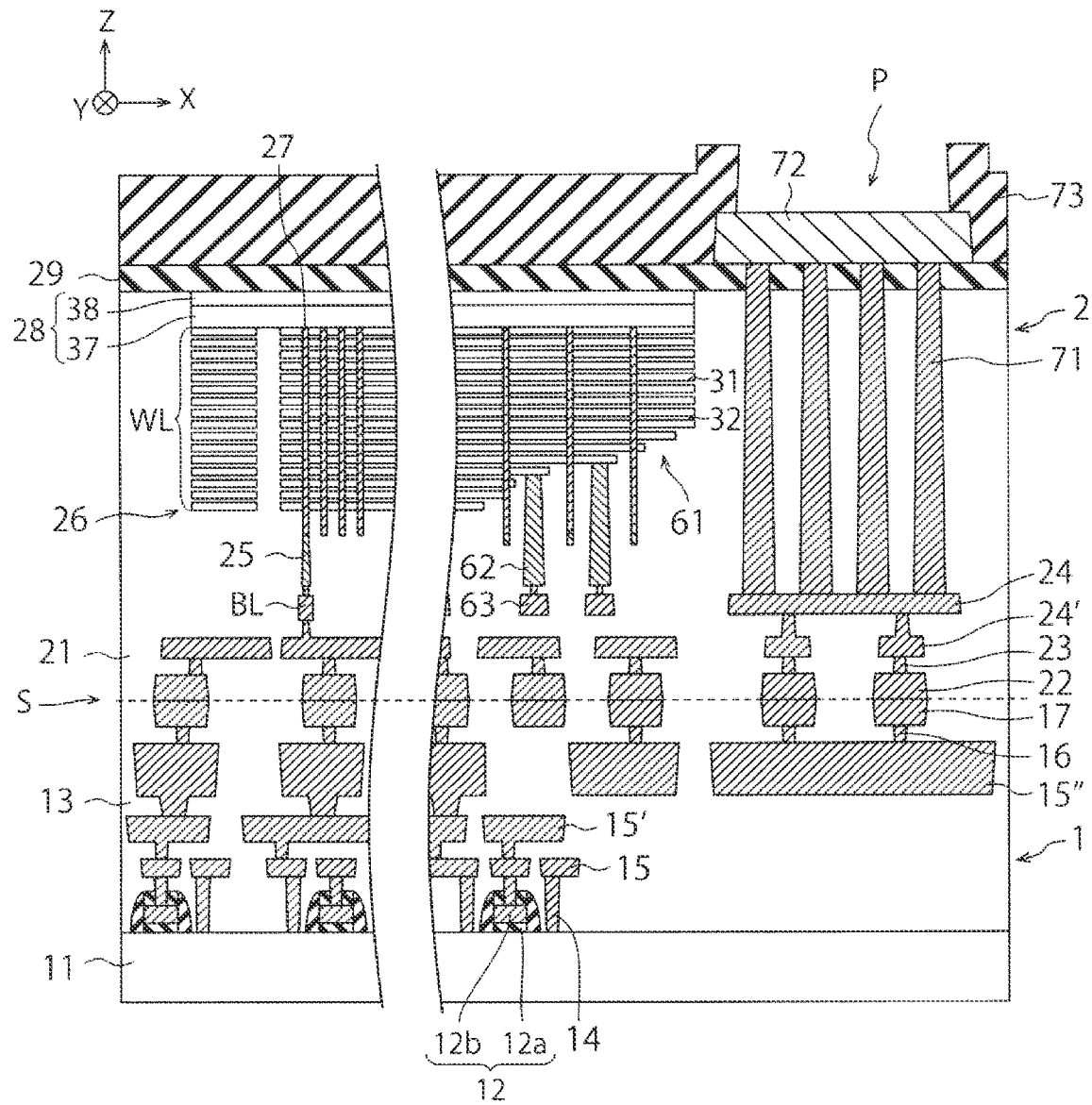
FIG. 12 is a cross-sectional view showing a structure of a semiconductor device according to another modification example of the first embodiment.

FIG. 12 is a cross-sectional view showing a structure of a semiconductor device according to another modification example of the first embodiment. The semiconductor device described with reference to FIGS. 1 to 11C may have the structure shown in FIG. 12 instead of having the structure shown in FIG. 1.

The semiconductor device according to the present modification example includes a circuit area 1 and an array area 2 as the same as in the semiconductor device according to the first embodiment. In addition to the elements shown in FIG. 1, the circuit area 1 includes wiring layers 15' and 15" that electrically connect a wiring layer 15 and a via plug 16. In addition to the elements shown in FIG. 1, the array area 2 includes a wiring layer 24' that electrically connects a via plug 23 and a wiring layer 24. Each of the wiring layers 15', 15", and 24' includes a plurality of wirings, as the same as in the wiring layer 15 and the wiring layer 24.

FIG. 12 shows a plurality of word lines WL (electrode layers 31) in a stacked film 26, a plurality of columnar portions 27 penetrating the stacked film 26, and a step structure portion 61 of the stacked film 26. Each word line WL is electrically connected to a word wiring layer 63 in the step structure portion 61 via a contact plug 62. Each columnar portion 27 is electrically connected to a bit line BL via the contact plug 25, and is electrically connected to a source layer 28. The word wiring layer 63 and the bit line BL according to the present modification example are provided in the wiring layer 24.

The array area 2 further includes a plurality of via plugs 71 provided on the wiring layer 24, a metal pad 72 provided on the via plugs 71 and an insulating film 29, and a passivation film 73 provided on the metal pad 72 and the insulating film 29. The passivation film 73 is, for example, a stacked insulating film containing a silicon oxide film, a silicon nitride film, or the like, and has an opening P that exposes an upper surface of the metal pad 72. The metal pad 72 is an external connection pad of the semiconductor device according to the present modification example, and can be connected to a mounting substrate or another device via a solder ball, a metal bump, a bonding wiring, or the like.

As described above, the semiconductor device according to the present embodiment is manufactured by bonding the substrate 11 and the substrate 41 to sandwich the semiconductor layer 42a, the dummy insulating film 43, and the semiconductor layer 44a therebetween, and by separating the substrate 11 and the substrate 41 from each other at the position of the semiconductor layer 42a, the dummy insulating film 43, or the semiconductor layer 44a. Therefore, according to the present embodiment, the substrates 11 and 41 can be appropriately separated after being bonded, and for example, the substrate 41 separated from the substrate 11 can be reused. The appropriate separation can be realized, for example, by performing porous formation of the semiconductor layers 42a and 44a by the laser annealing, or by separating the substrate 11 from the substrate 41 by laser irradiation or the like.

Second Embodiment

FIGS. 13A to 14C are cross-sectional views showing a semiconductor device manufacturing method according to a second embodiment. In the present embodiment, instead of the steps shown in FIGS. 3A to 4C in the first embodiment, the steps shown in FIGS. 13A to 14C are performed. In the following description, the description of matters common to the first embodiment will be omitted as appropriate.

Figure 13A:
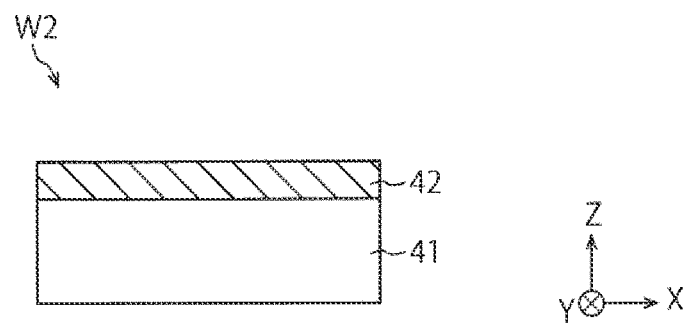
FIGS. 13A to 13C are cross-sectional views (1/2) showing a semiconductor device manufacturing method according to a second embodiment.
Figure 13B:
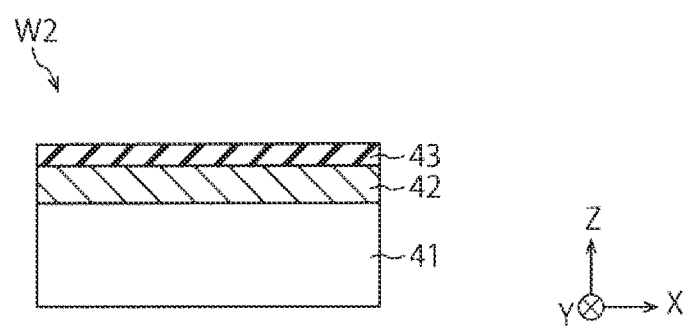

First, a substrate 41 is prepared, and a semiconductor layer 42 is formed on the substrate 41 (FIG. 13A). The semiconductor layer 42 is, for example, an amorphous semiconductor layer such as an amorphous Si layer. It is noted that the semiconductor layer 42 according to the present embodiment does not need to contain impurity atoms such as H atoms and noble gas atoms at this point.

Figure 13C:
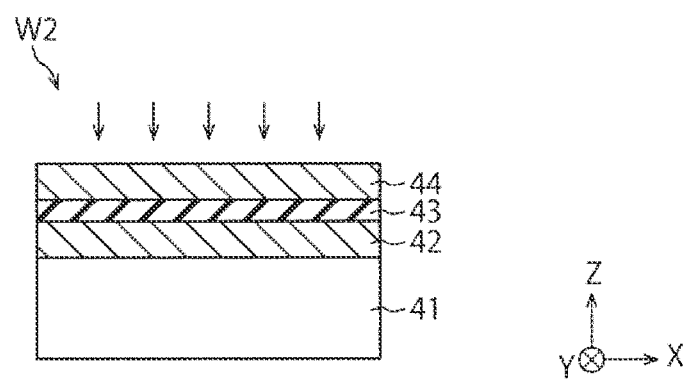

Next, a dummy insulating film 43 is formed on the semiconductor layer 42 (FIG. 13B), and the semiconductor layer 44 is formed on the dummy insulating film 43 (FIG. 13C). The semiconductor layer 44 is, for example, an amorphous semiconductor layer such as an amorphous Si layer. It is noted that the semiconductor layer 44 according to the present embodiment does not need to contain the impurity atoms such as H atoms and noble gas atoms at this point.

Next, plasma doping is performed on the semiconductor layers 44 and 42 (FIG. 13C). As a result, the impurity atoms are injected into the semiconductor layers 44 and 42. This impurity atom is, for example, an H atom. The plasma doping according to the present embodiment is performed so that the H atom concentration in the semiconductor layer 44 and the H atom concentration in the semiconductor layer 42 become high concentrations, for example, to be equal to or higher than $1.0 \times 10^{21}/cm^3$. The impurity atoms may be atoms other than the H atoms, and may be the noble gas atoms such as the He atoms.

Figure 14A:
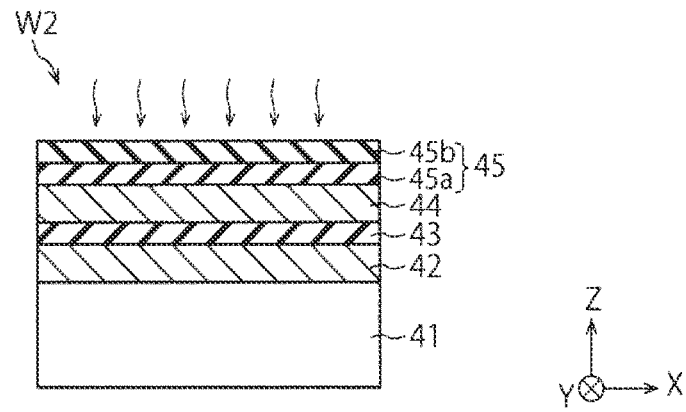
FIGS. 14A to 14C are cross-sectional views (2/2) showing the semiconductor device manufacturing method according to the second embodiment.

Next, a cap insulating film 45 is formed on the semiconductor layer 44 (FIG. 14A). The cap insulating film 45 includes an insulating film 45a formed on the semiconductor layer 44 and an insulating film 45b formed on the insulating film 45a.

Figure 14B:
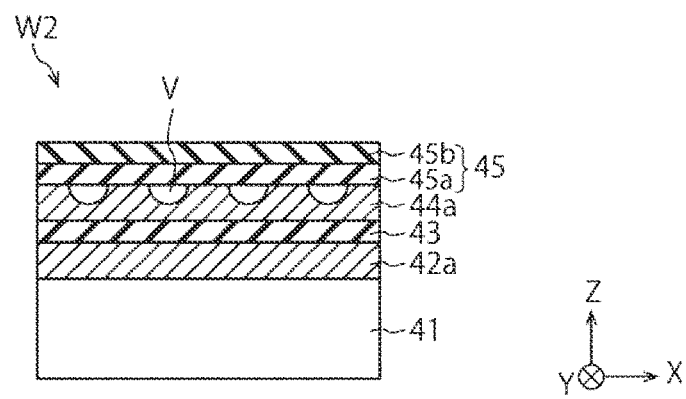

Next, Rapid Thermal Anneal (RTA) of an array wafer W2 is performed (FIG. 14A). As a result, the semiconductor layers 42 and 44 are heated and melted. Thereafter, the semiconductor layers 42 and 44 are crystallized and changed into semiconductor layers 42a and 44a, respectively (FIG. 14B). The semiconductor layers 42a and 44a according to the present embodiment are, for example, porous semiconductor layers such as a porous poly Si layer, as the same as in the semiconductor layers 42a and 44a according to the first embodiment. The semiconductor layers 42 and 44 according to the present embodiment are also made porous at the time of crystallization, thereby being changed into a porous poly Si layer which is a poly Si layer and a porous layer. The array wafer W2 may be annealed by a method other than RTA.

Being made porous according to the present embodiment occurs when impurity atoms in the semiconductor layers 42 and 44 gather to form a large number of voids such as bubbles. When the semiconductor layers 42 and 44 are made porous by plasma doping and RTA, large voids are likely to be generated. FIG. 14B shows a large void V generated in the semiconductor layer 44.

In the present embodiment, the concentration of impurity atoms in the semiconductor layer 44 tends to be high, but the concentration of impurity atoms in the semiconductor layer 42 is unlikely to be high. A reason for this is that the impurity atoms injected into the semiconductor layer 42 pass through the semiconductor layer 44 and the dummy insulating film 43 and reach the semiconductor layer 42. Therefore, the concentration of impurity atoms in the semiconductor layer 42 may be less than $1.0 \times 10^{21}/cm^3$. Furthermore, in order to make the concentration of impurity atoms in the semiconductor layer 42 be equal to or higher than $1.0 \times 10^{21}/cm^3$, the concentration of impurity atoms in the semiconductor layer 44 may need to be significantly higher than $1.0\times10^{21}/cm^3$. In FIG. 14B, since the concentration of the impurity atoms in the semiconductor layer 42 is lower than the concentration of the impurity atoms in the semiconductor layer 44, a large void V is generated only in the semiconductor layer 44. A method for dealing with the problem will be described later.

Figure 14C:
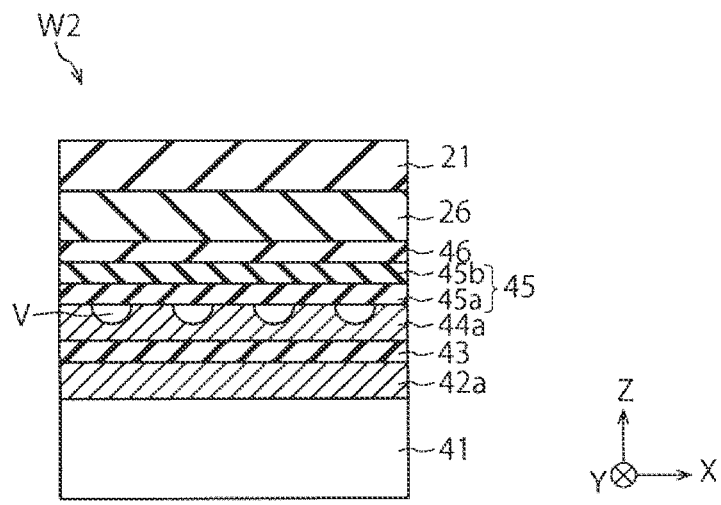

Next, the insulating film 46, the stacked film 26, and the interlayer insulating film 21 are formed on the cap insulating film 45 in order (FIG. 14C). After that, the semiconductor device of FIG. 1 is manufactured by performing the steps shown in FIGS. 5A to 9B. At this time, the method according to the modification example shown in FIGS. 10A to 11C may be adopted, or the structure according to the modification example shown in FIG. 12 may be adopted.

FIGS. 15A to 16C are cross-sectional views showing a semiconductor device manufacturing method according to a modification example of the second embodiment. In the present modification example, instead of the steps shown in FIGS. 13A to 14C in the second embodiment, the steps shown in FIGS. 15A to 16C are performed. In the following description, the description of matters common to the second embodiment will be omitted as appropriate.

Figure 15A:
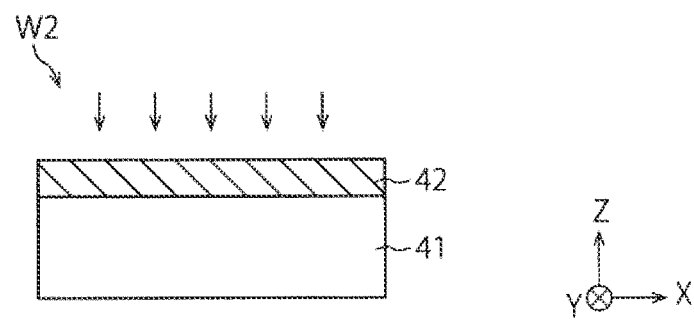
FIGS. 15A to 15C are cross-sectional views (1/2) showing a semiconductor device manufacturing method according to a modification example of the second embodiment.
Figure 15B:
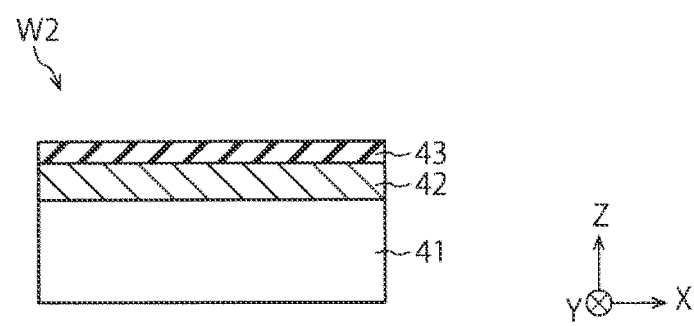

First, a substrate 41 is prepared, and a semiconductor layer 42 is formed on the substrate 41 (FIG. 15A). The semiconductor layer 42 is, for example, an amorphous semiconductor layer such as an amorphous Si layer. It is noted that the semiconductor layer 42 according to the present modification example does not need to contain impurity atoms such as H atoms and noble gas atoms at this point.

Next, plasma doping is performed on the semiconductor layer 42 (FIG. 15A). As a result, the impurity atoms are injected into the semiconductor layer 42. This impurity atom is, for example, an H atom. The plasma doping is performed so that the H atom concentration in the semiconductor layer 42 becomes a high concentration, for example, to be equal to or higher than $1.0\times10^{21}/cm^3$. The impurity atoms may be atoms other than the H atoms, and may be the noble gas atoms such as the He atoms.

Figure 15C:
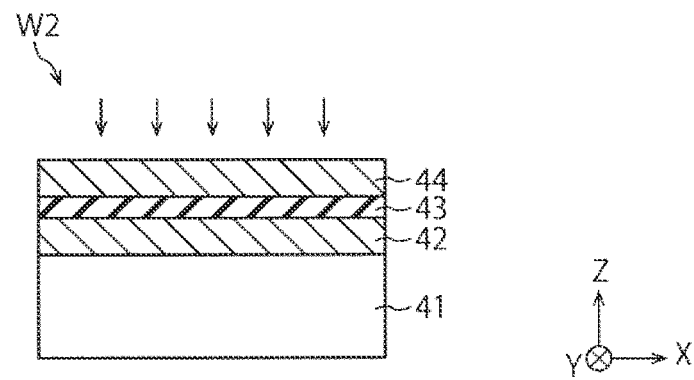

Next, a dummy insulating film 43 is formed on the semiconductor layer 42 (FIG. 15B), and a semiconductor layer 44 is formed on the dummy insulating film 43 (FIG. 15C). The semiconductor layer 44 is, for example, an amorphous semiconductor layer such as an amorphous Si layer. It is noted that the semiconductor layer 44 according to the present modification example does not need to contain the impurity atoms such as H atoms and noble gas atoms at this point.

Next, plasma doping is performed on the semiconductor layer 44 (FIG. 15C). As a result, the impurity atoms are injected into the semiconductor layer 44. This impurity atom is, for example, an H atom. The plasma doping is performed so that the H atom concentration in the semiconductor layer 44 becomes a high concentration, for example, to be equal to or higher than $1.0\times10^{21}/cm^3$. The impurity atoms may be atoms other than the H atoms, and may be the noble gas atoms such as the He atoms.

The plasma doping in the step shown in FIG. 15C may be performed so that the impurity atoms are injected into the semiconductor layers 44 and 42. In this case, the H atom concentration in the semiconductor layer 42 may be less than $1.0\times10^{21}/cm^3$ before the plasma doping, and may be equal to or higher than $1.0\times10^{21}/cm^3$ after the plasma doping.

Figure 16A:
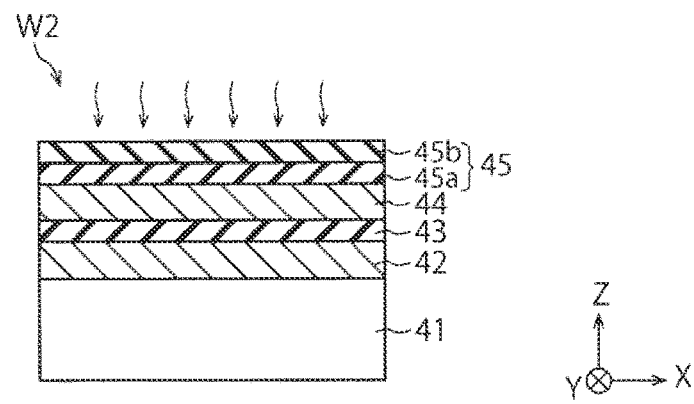
FIGS. 16A to 16C are cross-sectional views (2/2) showing the semiconductor device manufacturing method according to the modification example of the second embodiment.

Next, the cap insulating film 45 is formed on the semiconductor layer 44 (FIG. 16A). The cap insulating film 45 includes an insulating film 45a formed on the semiconductor layer 44 and an insulating film 45b formed on the insulating film 45a.

Figure 16B:
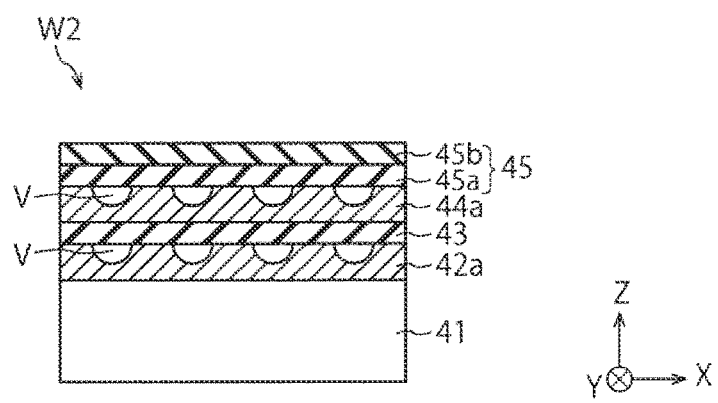

Next, Rapid Thermal Anneal (RTA) of the array wafer W2 is performed (FIG. 16A). As a result, the semiconductor layers 42 and 44 are heated and melted. After that, the semiconductor layers 42 and 44 are crystallized and changed into semiconductor layers 42a and 44a, respectively (FIG. 16B). The semiconductor layers 42a and 44a according to the present modification example are, for example, porous semiconductor layers such as a porous poly Si layer, as the same as in the semiconductor layers 42a and 44a of the first and second embodiments. The semiconductor layers 42 and 44 according to the present modification example are also made porous at the time of crystallization, thereby being changed into a porous poly Si layer which is a poly Si layer and a porous layer. The array wafer W2 may be annealed by a method other than RTA.

Being made porous according to the present modification example occurs when impurity atoms in the semiconductor layers 42 and 44 gather to form a large number of voids such as bubbles. When the semiconductor layers 42 and 44 are made porous by plasma doping and RTA, large voids are likely to be generated. FIG. 16B shows large voids V generated in the semiconductor layers 42 and 44. In FIG. 16B, since the concentrations of the impurity atoms in the semiconductor layers 42 and 44 are both high, the large voids V are generated in the semiconductor layers 42 and 44.

Figure 16C:
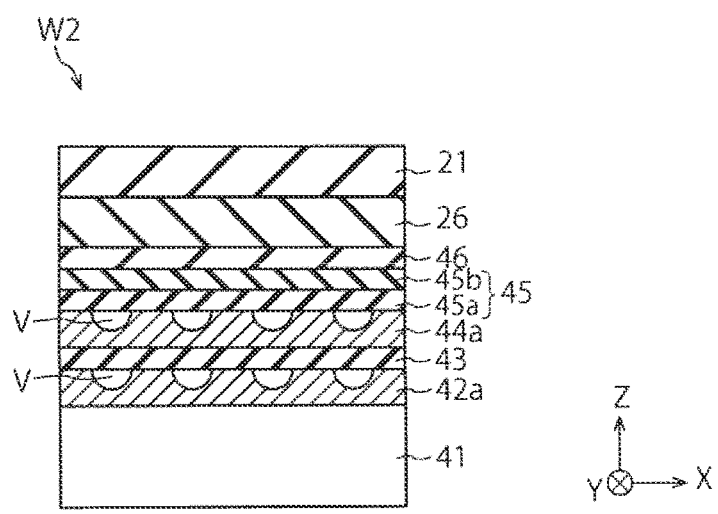

Next, the insulating film 46, the stacked film 26, and the interlayer insulating film 21 are formed on the cap insulating film 45 in order (FIG. 16C). After that, the semiconductor device of FIG. 1 is manufactured by performing the steps shown in FIGS. 5A to 9B. At this time, the method according to the modification example shown in FIGS. 10A to 11C may be adopted, or the structure according to the modification example shown in FIG. 12 may be adopted.

As described above, the semiconductor device according to the present embodiment is manufactured by bonding the substrate 11 and the substrate 41 to sandwich the semiconductor layer 42a, the dummy insulating film 43, and the semiconductor layer 44a therebetween, and by separating the substrate 11 and the substrate 41 from each other at the position of the semiconductor layer 42a, the dummy insulating film 43, or the semiconductor layer 44a. Therefore, according to the present embodiment, the substrates 11 and 41 can be appropriately separated after being bonded, and for example, the substrate 41 separated from the substrate 11 can be reused. Such appropriate separation can be realized, for example, by causing the semiconductor layers 42a and 44a to be made porous through the plasma doping and the RTA, or by separating the substrates 11 and 41 through laser irradiation or the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device manufacturing method comprising:

forming a first film containing a first device on a first substrate;

forming a second film containing a semiconductor layer on a second substrate, wherein the second film includes a first semiconductor layer formed on the second substrate, a first insulating film formed on the first semiconductor layer, and a second semiconductor layer formed on the first insulating film;

changing the semiconductor layer into a porous layer by changing at least one of the first semiconductor layer or the second semiconductor layer from an amorphous layer to the porous layer;

forming a third film containing a second device on the second film;

bonding the first substrate and the second substrate to sandwich the first film, the third film, and the second film therebetween; and separating the first substrate and the second substrate from each other at a position of the second film;

wherein the first insulating film is formed between the first semiconductor layer and the second semiconductor layer.

2. The semiconductor device manufacturing method according to claim 1, wherein the step of changing the semiconductor layer into a porous layer further comprises:

performing laser annealing or plasma doping and annealing on the semiconductor layer.

3. The semiconductor device manufacturing method according to claim 1, wherein the semiconductor layer contains hydrogen atoms or noble gas atoms.

4. The semiconductor device manufacturing method according to claim 3, wherein a concentration of the hydrogen atoms or the noble gas atoms in the semiconductor layer is equal to or higher than $1.0 \times 10^{21}/cm^3$.

5. The semiconductor device manufacturing method according to claim 1, wherein the third film is formed on the second film via a second insulating film.

6. The semiconductor device manufacturing method according to claim 5, wherein the second insulating film includes a third insulating film containing silicon atoms and oxygen atoms, and a fourth insulating film containing silicon atoms and nitrogen atoms.

7. The semiconductor device manufacturing method according to claim 1, wherein at least one of the first semiconductor layer or second semiconductor layer is in contact with the first insulating film.

8. The semiconductor device manufacturing method according to claim 1, wherein the first substrate and the second substrate are separated at the position of the second film by irradiating the first insulating film with laser.

9. The semiconductor device manufacturing method according to claim 8, wherein the laser contains infrared light.

10. The semiconductor device manufacturing method according to claim 1, wherein the first substrate and the second substrate are separated at the position of the second film by applying a force to the second film.

11. The semiconductor device manufacturing method according to claim 1, wherein one of the first and second devices includes a memory cell array, and the other one of the first and second devices includes a circuit configured to control the memory cell array.

12. The semiconductor device manufacturing method according to claim 1, further comprising:

reusing the second substrate separated from the first substrate.

13. A substrate reusing method comprising:

preparing a first substrate and a second substrate;

forming a first semiconductor layer on the second substrate, a first insulating film formed on the first semiconductor layer, and a second semiconductor layer formed on the first insulating film;

changing at least one of the first semiconductor layer or the second semiconductor layer from an amorphous layer into a porous layer;

bonding the first substrate and the second substrate to sandwich the film therebetween;

separating the first substrate and the second substrate from each other at a position of the film; and reusing the second substrate separated from the first substrate.

* * * * *